(12) United States Patent
Beom et al.

(10) Patent No.: US 7,876,089 B2
(45) Date of Patent: Jan. 25, 2011

(54) TEST HANDLER, METHOD FOR LOADING AND MANUFACTURING PACKAGED CHIPS, AND METHOD FOR TRANSFERRING TEST TRAYS

(75) Inventors: Hee Rak Beom, Seoul (KR); Kyeong Tae Kim, Suwon-Si (KR)

(73) Assignee: Mirae Corporation, Chugcheongnam-do (KR)

( * ) Notice: Subject to any disclaimer, the term of this patent is extended or adjusted under 35 U.S.C. 154(b) by 57 days.

(21) Appl. No.: 12/339,785

(22) Filed: Dec. 19, 2008

(65) Prior Publication Data
US 2009/0167294 A1    Jul. 2, 2009

(30) Foreign Application Priority Data
Dec. 28, 2007   (KR) .................. 10-2007-0140563

(51) Int. Cl.
*G01R 31/28*    (2006.01)
(52) U.S. Cl. .................... 324/158.1; 324/765
(58) Field of Classification Search ............ 324/765, 324/158.1; 414/403–404
See application file for complete search history.

(56) References Cited

U.S. PATENT DOCUMENTS

| | | | |
|---|---|---|---|
| 7,023,197 B2* | 4/2006 | Jung | .................. 324/158.1 |
| 7,196,508 B2* | 3/2007 | Ham et al. | .................. 324/158.1 |
| 2003/0177633 A1* | 9/2003 | Haji et al. | .................. 29/743 |
| 2005/0168214 A1* | 8/2005 | Kim | .................. 324/158.1 |
| 2006/0214655 A1* | 9/2006 | Ham et al. | .................. 324/158.1 |

FOREIGN PATENT DOCUMENTS

| | | |
|---|---|---|
| KR | 10-1999-0082838 | 11/1999 |
| KR | 10-0560729 | 3/2006 |

OTHER PUBLICATIONS

Korean Office Action dated Sep. 28, 2009.

* cited by examiner

*Primary Examiner*—Ha Tran T Nguyen
*Assistant Examiner*—Arleen M Vazquez
(74) *Attorney, Agent, or Firm*—KED & Associates, LLP

(57) ABSTRACT

A test handler, a packaged chip loading method, a test tray transferring method, and a packaged chip manufacturing method are provided. The test handler may include a loading unit, a chamber system, an unloading unit, at least one rotating unit and a transferring unit. The loading unit may include a loading buffer disposed to be movable along a moving path formed over a loading position and a loading picker to perform a loading process on the test tray located at the loading position. The chamber system having the packaged chips connected to a hi-fix board and tested. The unloading unit may include an unloading picker to perform an unloading process on the test tray located at an unloading position. The at least one rotating unit may be disposed between the loading unit and the unloading unit to rotate the test tray transferred from the loading unit from a horizontal posture to a vertical posture, and to rotate the test tray transferred from the chamber system from a vertical posture to a horizontal posture. The transferring unit may transfer the test tray.

21 Claims, 13 Drawing Sheets

TEST HANDLER, METHOD FOR LOADING AND MANUFACTURING PACKAGED CHIPS, AND METHOD FOR TRANSFERRING TEST TRAYS

BACKGROUND

1. Field

Embodiments of the present invention may relate to a test handler for connecting packaged chips to be tested to a tester and classifying packaged chips tested by the tester by grades based on the test result.

2. Background

A test handler may perform electrical tests on packaged chips at a conclusion of a packaging process.

The test handler is an apparatus for connecting packaged chips to be tested to a particular tester for testing the packaged chips and classifying the packaged chips tested by the tester by grades based on the test result.

The test handler may perform a loading process, an unloading process, and a testing process by use of a test tray including a plurality of containing units that contain the packaged chips.

In the loading process, packaged chips to be tested may be picked up from a user tray containing the packaged chips and may be contained into the test tray. The loading process may be performed by a picker system having nozzles that can suck and attach (or fix) to the packaged chips.

In the unloading process, tested packaged chips may be separated from the test tray and the separated packaged chips may be contained in user trays located at different positions based on the test result. The unloading process may be performed by the picker system.

In the testing process, the packaged chips contained in the test tray may be connected to a tester. The tester may include a hi-fix board to which the packaged chips to be tested are connected. The tester may test the packaged chips to determine electrical characteristics of the packaged chips connected to the hi-fix board.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
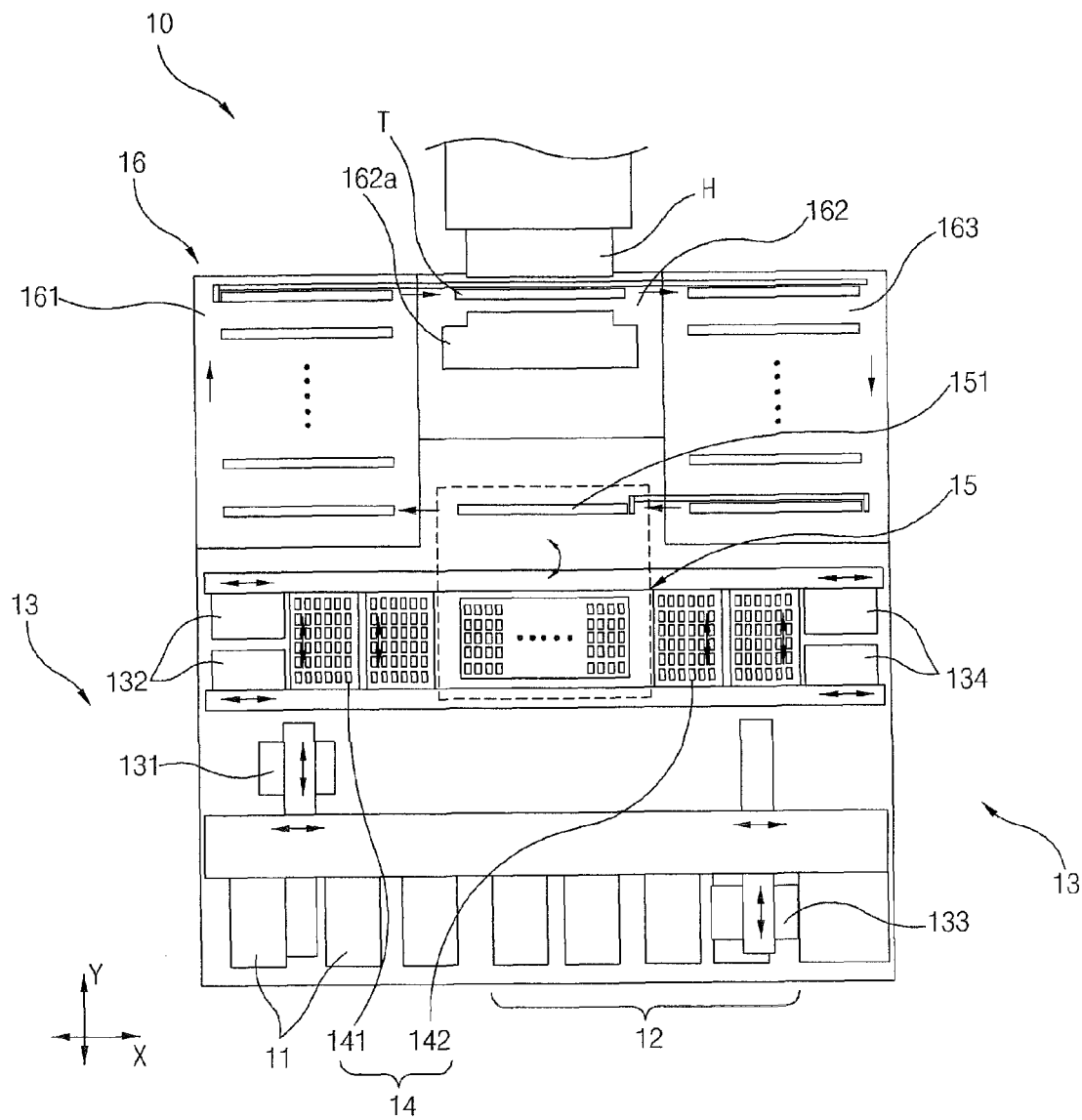
FIG. 1 is a plan view schematically illustrating a test handler according to an example arrangement.
Figure 2:
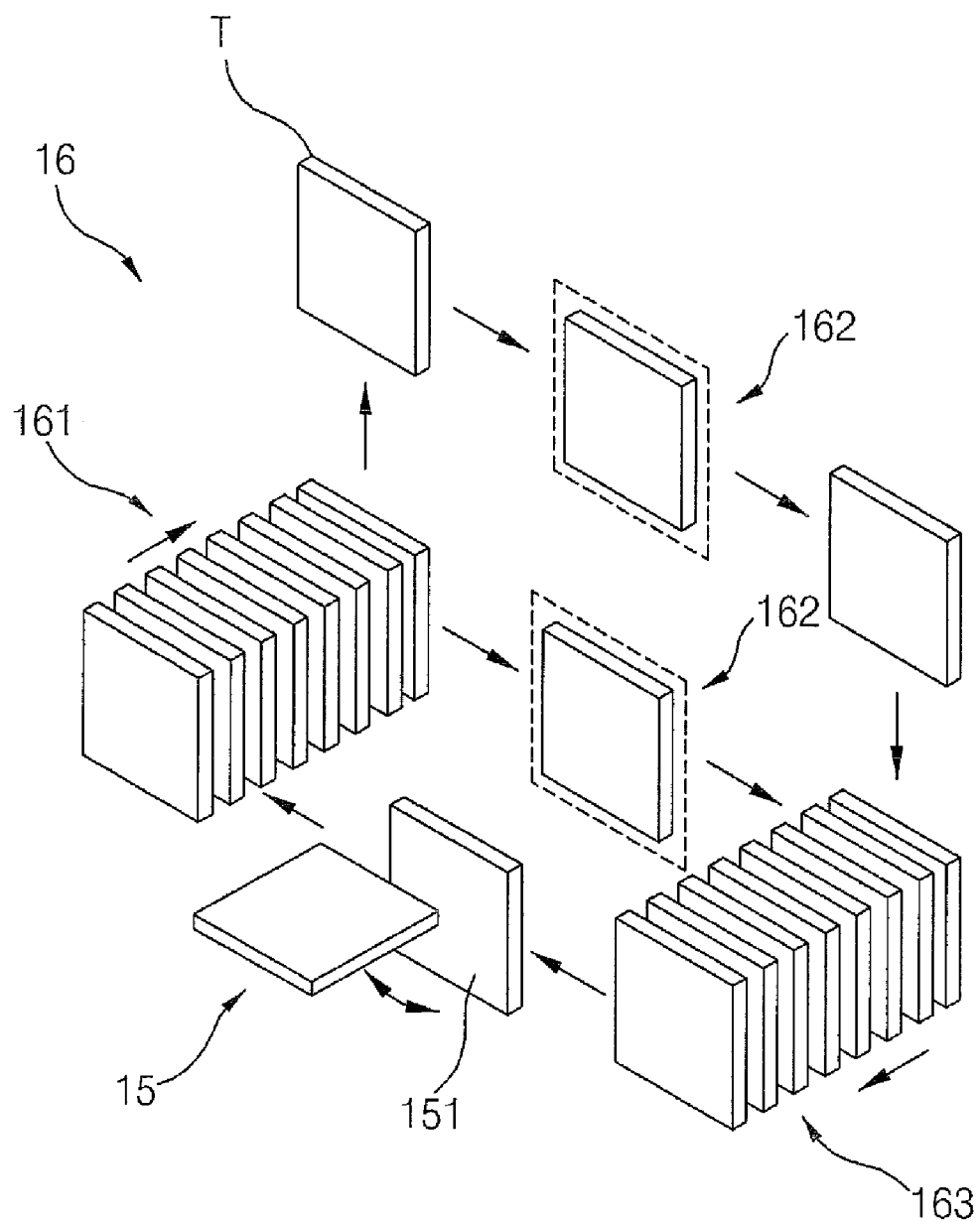
FIG. 2 is a diagram schematically illustrating a path through which a test tray is transferred in a test handler according to an example arrangement.

FIG. 1 is a plan schematically illustrating a test handler according to an example arrangement and FIG. 2 is a diagram schematically illustrating a path through which a test tray moves in the test handler according to an example arrangement. Reference numerals denoting the test trays in FIG. 2 indicate a configuration of the test handler at which the test trays are located.

As shown in FIGS. 1 and 2, a test handler 10 may include a loading stacker 11, an unloading stacker 12, a picker system 13, a buffer unit 14, an exchanging unit 15, and a chamber system 16.

The loading stacker 11 may store a plurality of user trays containing packaged chips to be tested.

The unloading stacker 12 may store a plurality of user trays containing tested packaged chips. The tested packaged chips may be provided in user trays located at different positions by grades based on the test result.

The picker system 13 may include nozzles that can suck and attach to the packaged chip. The picker system 13 may include a first loading picker 131, a second loading picker 132, a first unloading picker 133 and a second unloading picker 134.

The first loading picker 131 may pick up the packaged chips to be tested from the user tray located in the loading stacker 11 and provide the picked-up packaged chips to the buffer unit 14. The first loading picker 131 may move in or along an X axis direction and a Y axis direction and can ascend and/or descend.

The second loading picker 132 may pick up the packaged chips to be tested from the buffer tray 14 and contain the picked-up packaged chips in the test tray T located in the exchanging unit 15. The second loading picker 132 may move in or along the X axis direction and can ascend and/or descend.

The first unloading picker 133 may pick up the tested packaged chips from the buffer unit 14 and contain the picked-up packaged chips in a user tray located in the unloading stacker 12. The first unloading picker 133 may move in or a long the X axis direction and the Y axis direction and can ascend and/or descend.

The second unloading picker 134 may separate the tested packaged chips from the test tray T located in the exchanging unit 15 and provide the separated packaged chip to the buffer unit 14. The second unloading picker 134 can move in or along the X axis direction and can ascend and/or descend.

The buffer unit 14 may move in or along the Y axis direction and may temporarily contain the packaged chips. The buffer unit 14 may include a loading buffer 141 and an unloading buffer 142.

The loading buffer 141 may be provided on one side of the exchanging unit 15 and may temporarily contain the packaged chips to be tested.

The unloading buffer 142 may be provided on the other side of the exchanging unit 15 and may temporarily contain the tested packaged chips.

The exchanging unit 15 may exchange the test tray T containing the packaged chips to the tested and the test tray T containing the tested packaged chips with the chamber system 16. The test tray T containing the packaged chips to be tested may be transferred to the chamber system 16 from the exchanging unit 15. The test tray T containing the tested packaged chips may be transferred to the exchanging unit 15 from the chamber system 16.

In the exchanging unit 15, the tested packaged chips may be separated from the test tray T and the packaged chips to be tested may be contained in the test tray T.

The exchanging unit 15 may include a rotating unit 151 to rotate the test tray T. The rotating unit 151 can rotate the test tray T containing the packaged chips to be tested from a horizontal posture (or horizontal position) to a vertical posture (or vertical position). The rotating unit 151 can rotate the test tray T containing the tested packaged chips from the vertical posture to the horizontal posture.

The chamber system 16 may include a first chamber 161, a second chamber 162 and a third chamber 163 for the tester to test the packaged chips under environments of high temperature, low temperature and normal temperature.

The first chamber 161 may heat or cool the packaged chips contained in the test tray T while allowing the test tray T to move therein. The packaged chips to be tested may be adjusted to a temperature range (hereinafter referred to as "testing temperature") in which the packaged chips may be tested by the tester. When the packaged chips to be tested are adjusted to the testing temperature, the test tray T may be transferred from the first chamber 161 to the second chamber 162.

The second chamber 162 may connect the packaged chips adjusted to the testing temperature to the hi-fix board H. The second chamber 162 may be provided with a contact unit 162a that connects the packaged chips adjusted to the testing temperature to the hi-fix board H, where a part or all of the hi-fix board H is inserted into the contact unit 162a. The test handler 10 may include a plurality of second chambers 162. When the packaged chips are tested, the test tray T may be transferred from the second chamber 162 to the third chamber 163.

The third chamber 163 may allow the test tray T to move therein and the third chamber 163 may restore the tested packaged chips contained in the test tray T to the normal temperature. When the packaged chips are restored to the normal temperature or a temperature close to the normal temperature, the test tray T may be transferred from the third chamber 163 to the exchanging unit 15.

The test handler 10 having the above-described arrangement may have problems and/or disadvantages.

In the exchanging unit 15, a process of containing the packaged chips to be tested in the containing units, which are empty by separating the tested packaged chip from the test tray T, may be continuously performed. Accordingly, the process may be complicated and an error occurrence frequency may be high.

Additionally, when an error occurs in one of the processes of containing the packaged chips to be tested in the test tray T and separating the tested packaged chips from the test tray T, other processes may be stopped. Accordingly, efficiency of the processes may deteriorate.

Still further, the test handler 10 may be developed as a high-speed type to perform the loading process, the unloading process, and the testing process on more packaged chips for a short amount of time. There is a need for reducing time for the loading process and the unloading process. However, as described above, under environments that the processes are complicated and not efficient and having a high error occurrence frequency, a reduction in process time may be limited.

Embodiments of the present invention may provide a test handler capable of normally performing other processes even when an error occurs in one of the loading process and the unloading process.

A test handler and a packaged chip loading method may be provided that are capable of reducing an error occurrence frequency by simplifying the loading process and the unloading process and reducing a time for the loading process.

A test handler and a test tray transferring method may be provided that are capable of reducing a wait time of a test tray by efficiently transferring the test tray and reducing the time for the loading process and the unloading process.

A packaged chip manufacturing method may be provided that is capable of reducing a time for the loading process and the unloading process and manufacturing more packaged chips for a short amount of time, thereby strengthening competitive power of products such as cost reduction.

Figure 3:
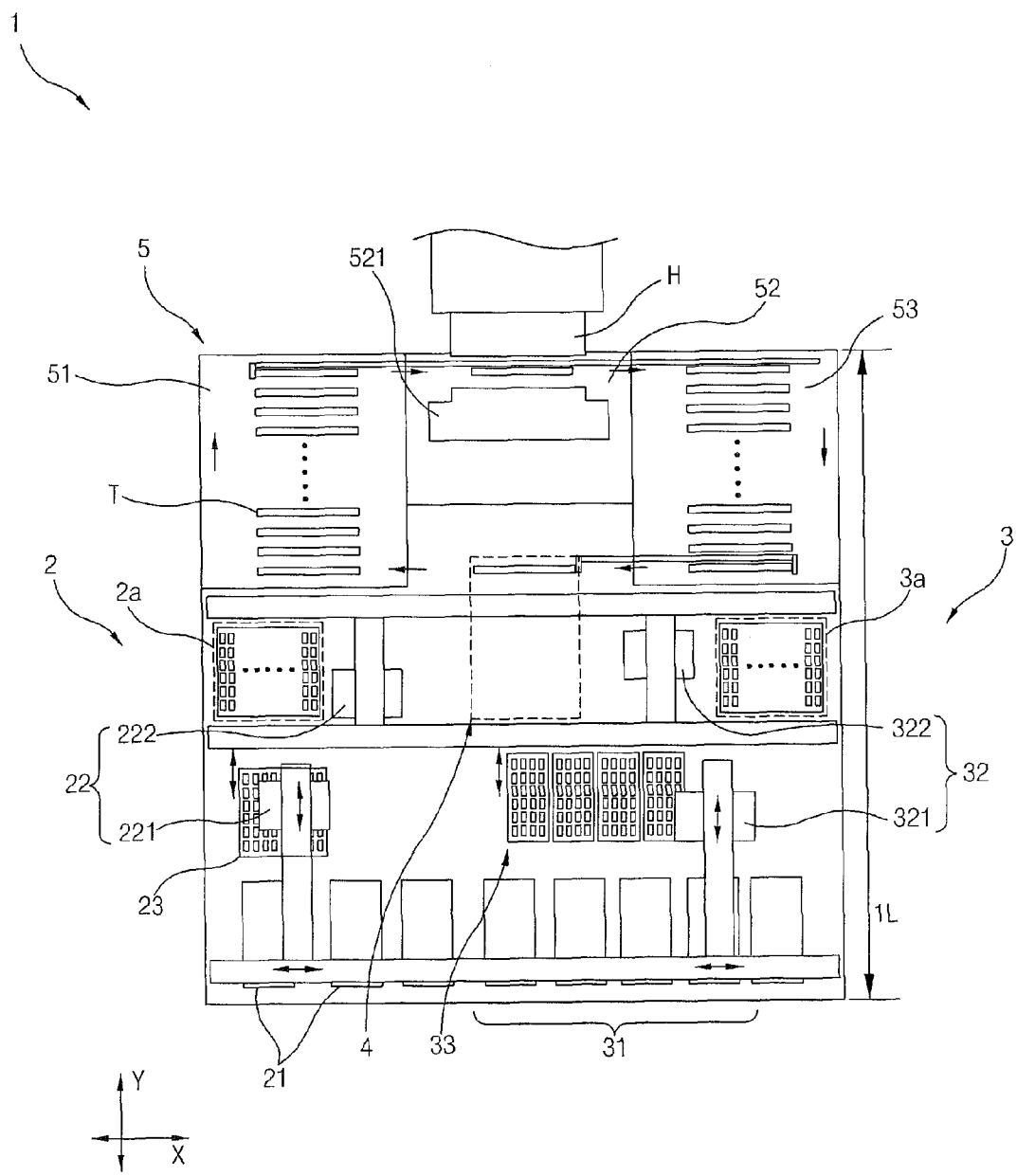
FIG. 3 is a plan view schematically illustrating a test handler according to an example embodiment of the invention.
Figure 4A:
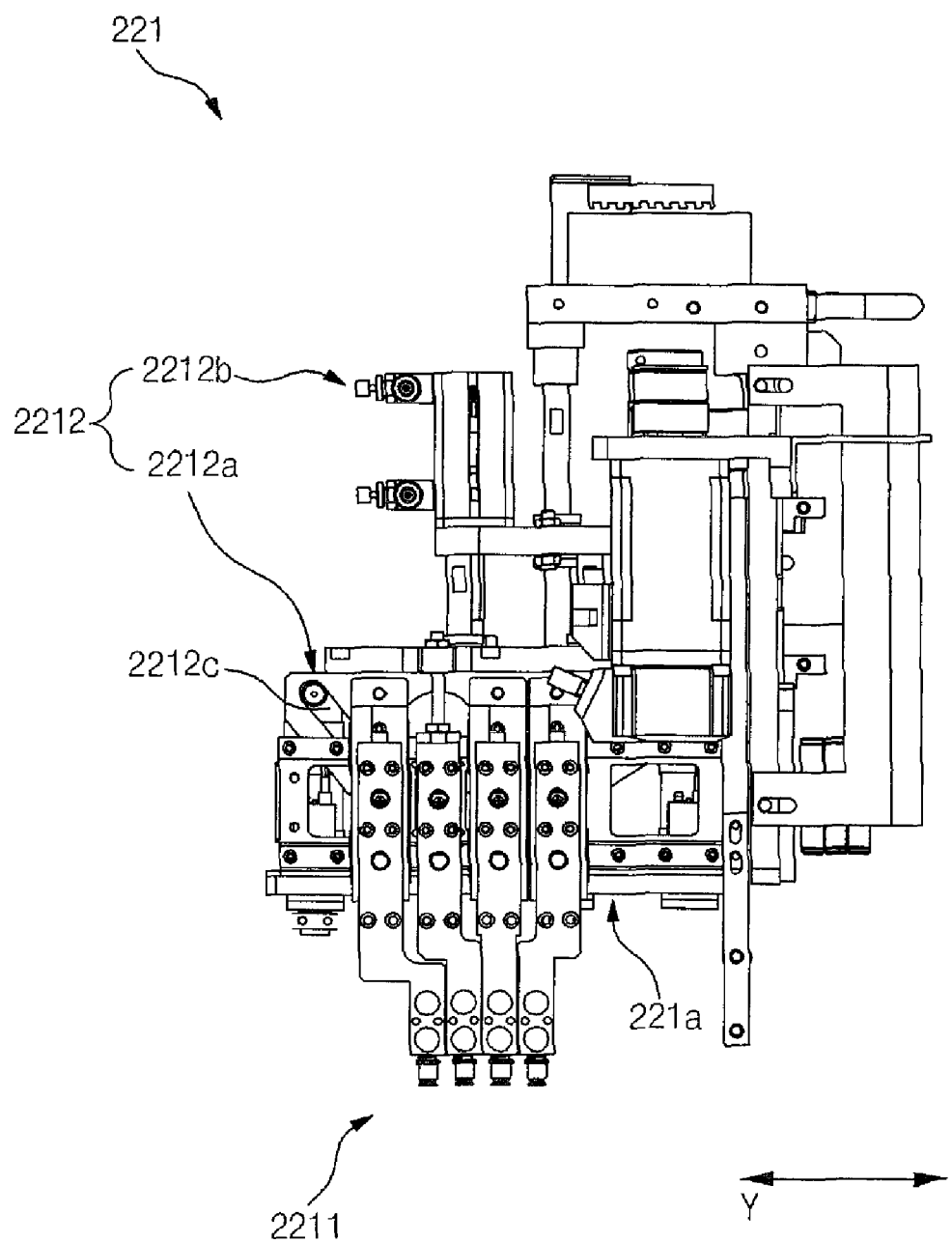
FIGS. 4A and 4B are side views schematically illustrating an example of a loading picker.
Figure 4B:
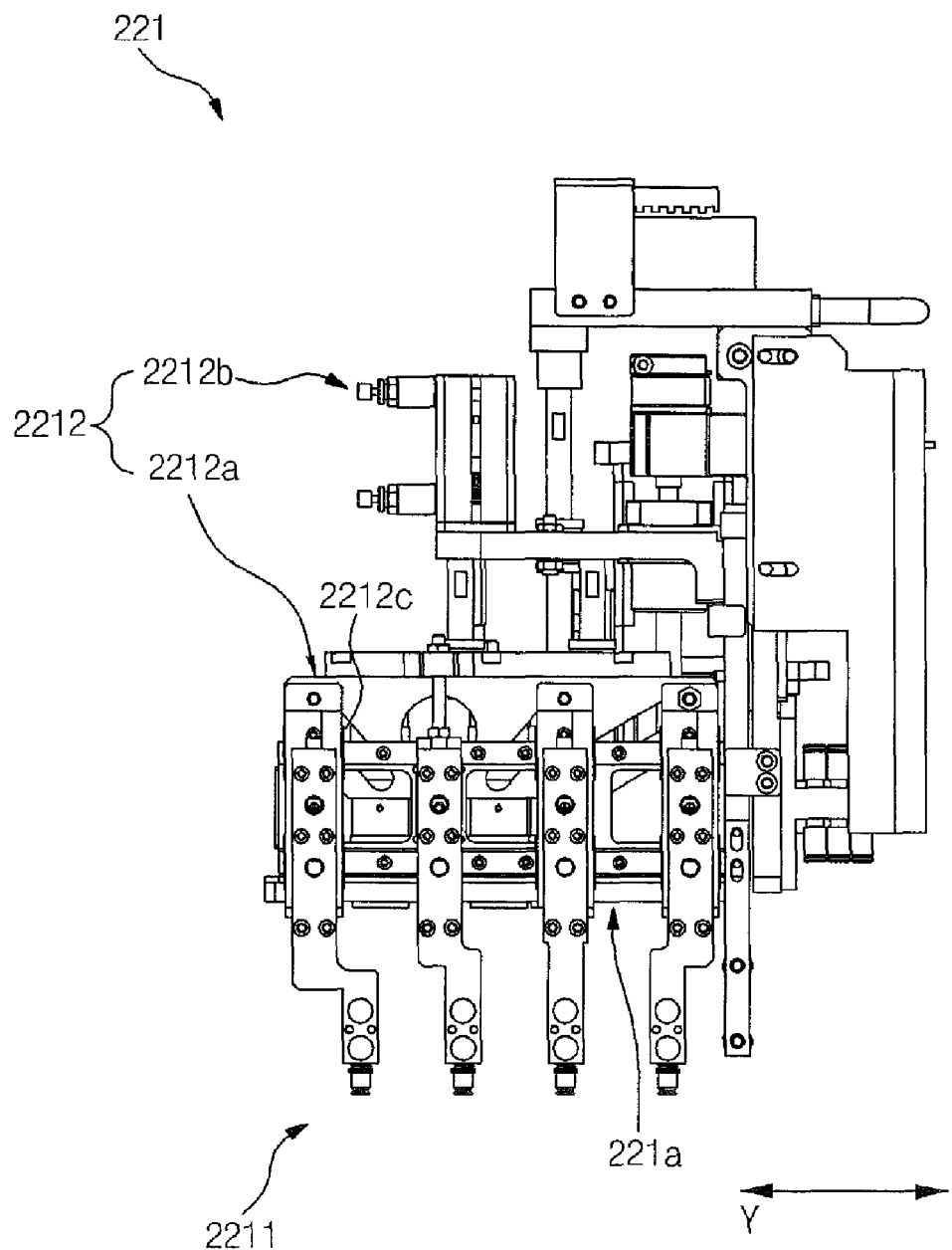
Figure 5:
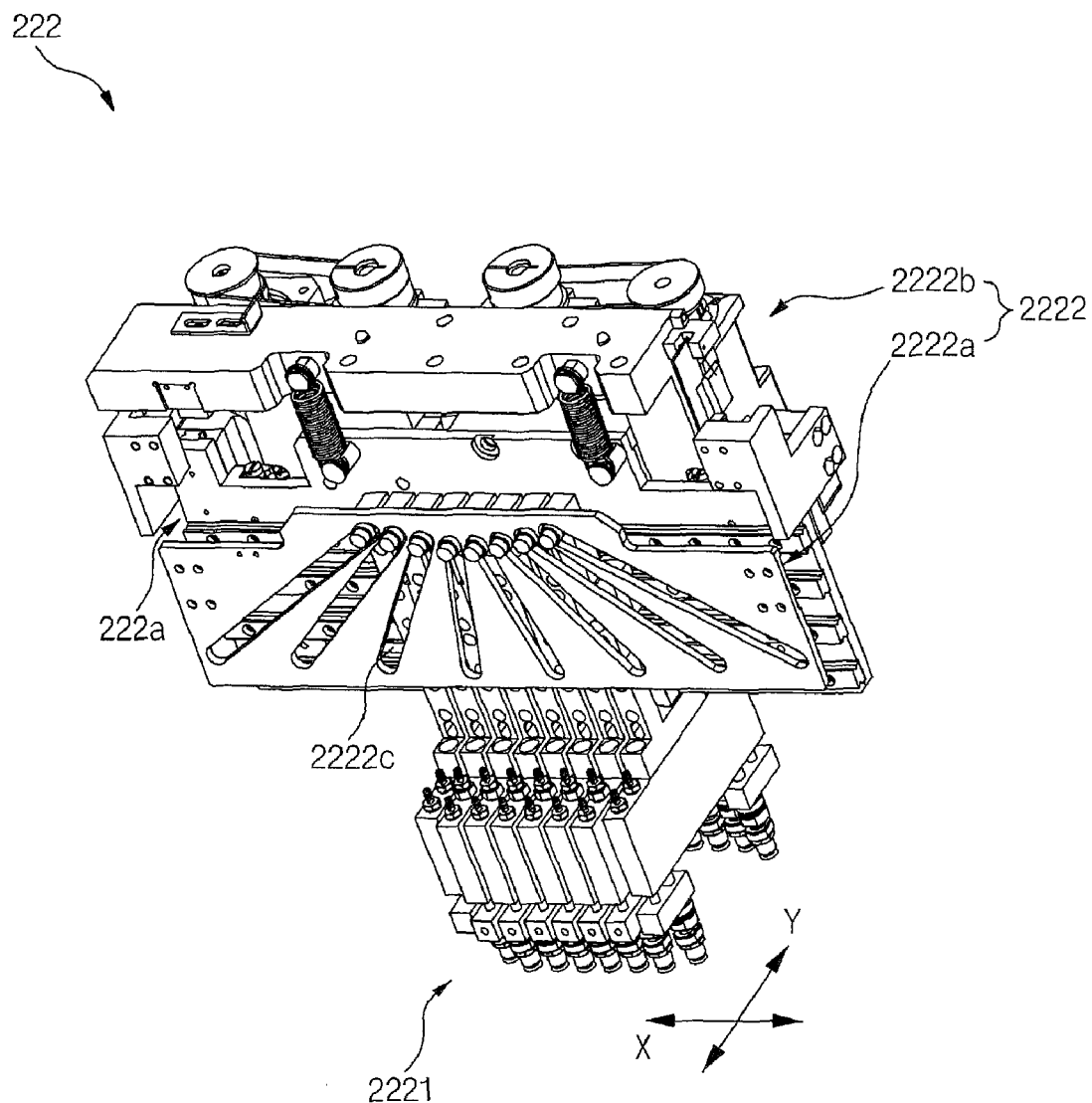
FIG. 5 is a perspective view schematically illustrating another example of a loading picker.
Figure 6:
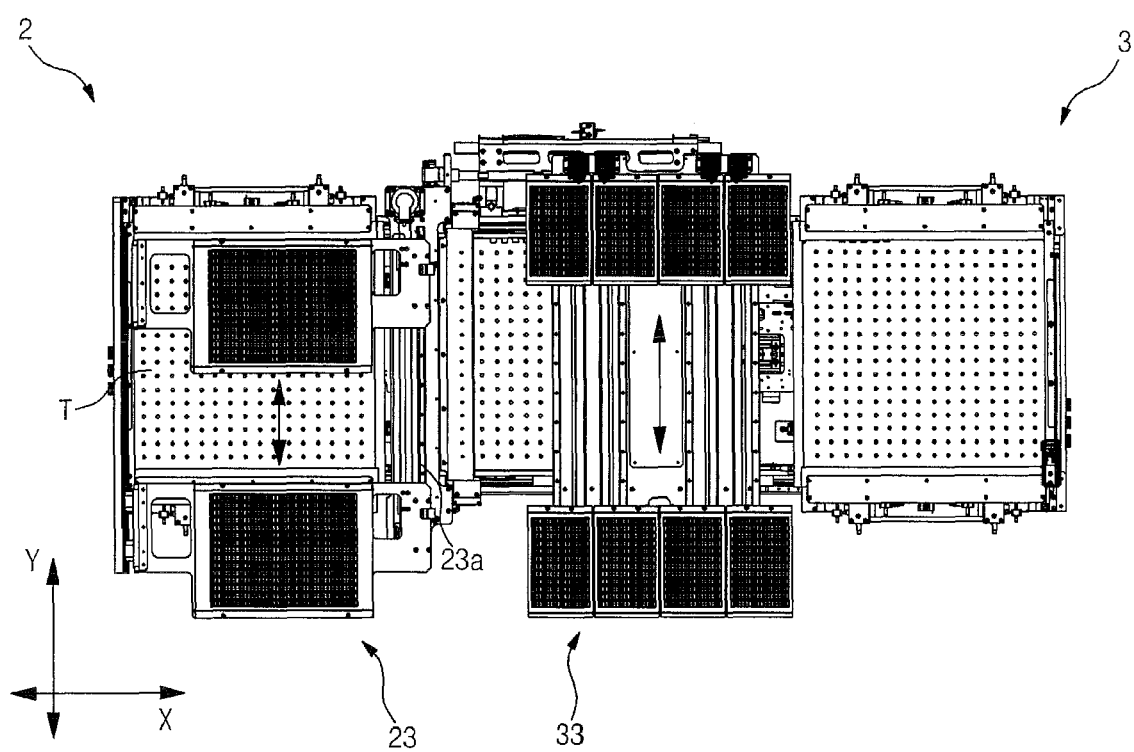
FIG. 6 is a plan view schematically illustrating a loading unit and an unloading unit.
Figure 9:
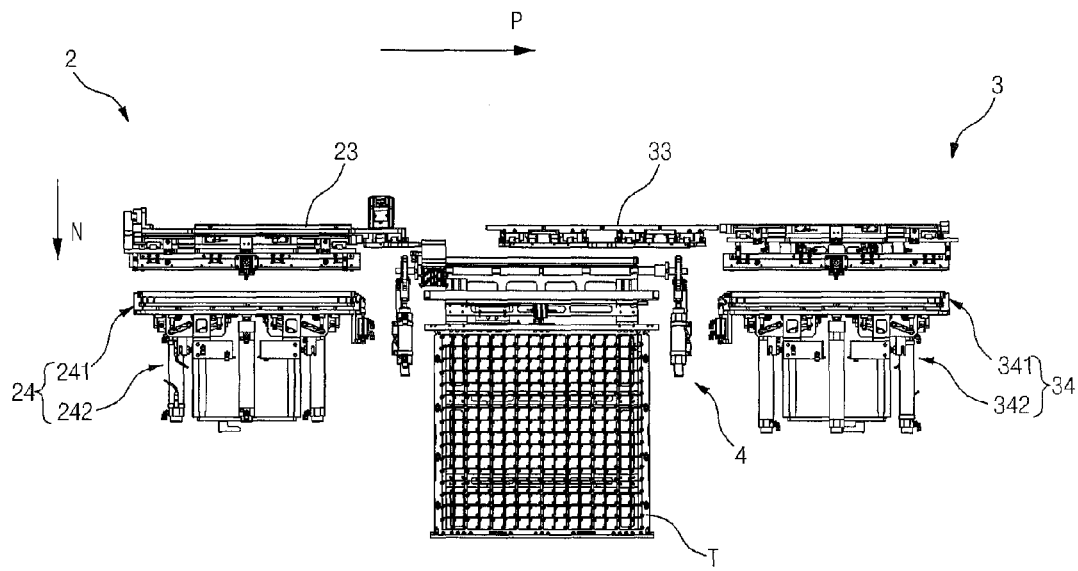
FIG. 9 is a front view schematically illustrating a loading unit, an unloading unit, and a rotating unit.
Figure 10:
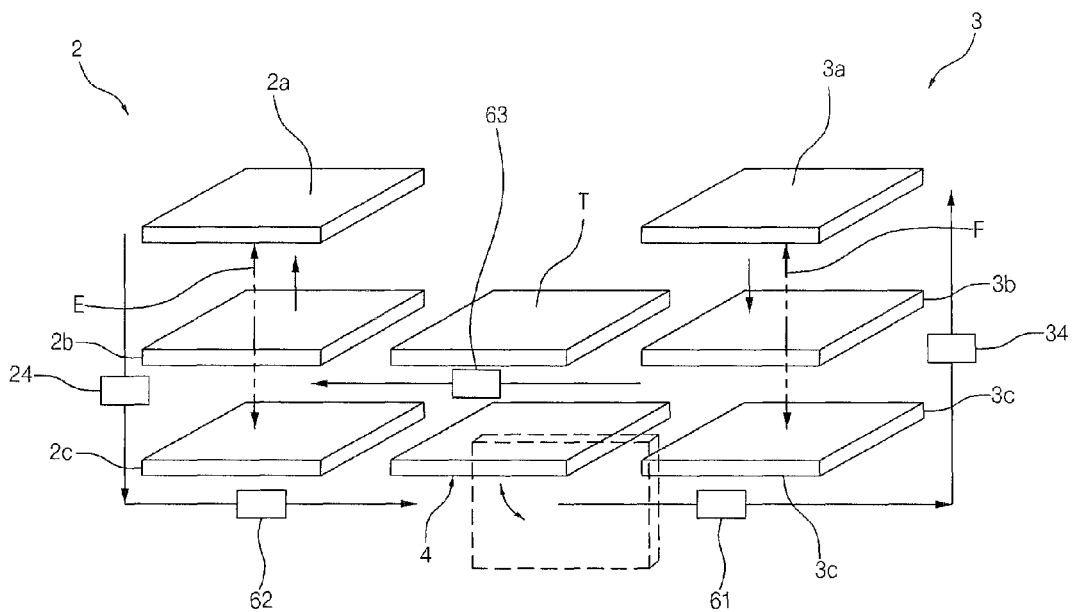
FIG. 10 is a diagram schematically illustrating a path through which a test tray is transferred between a loading unit, a rotation unit, and an unloading unit.
Figure 11:
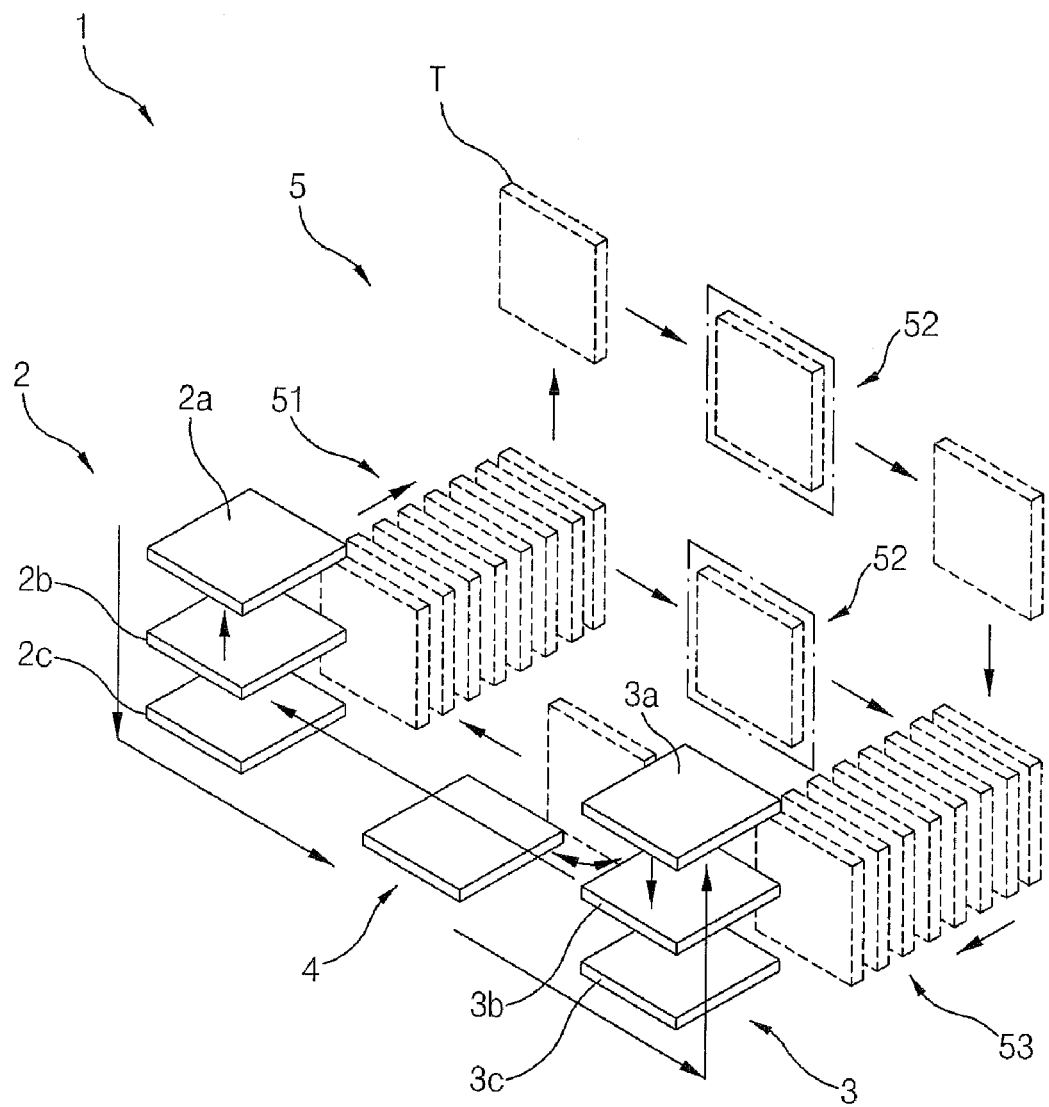
FIG. 11 is a diagram schematically illustrating a path through which a test tray is transferred in a test handler according to an example embodiment of the invention.

FIG. 3 is a plan view schematically illustrating a test handler according to an example embodiment of the present invention. FIGS. 4A and 4B are side views schematically illustrating an example of a loading picker. FIG. 5 is a perspective view schematically illustrating another example of a loading picker. FIG. 6 is a plan view schematically illustrating a loading unit and an unloading unit. FIGS. 7A to 7D are side views schematically illustrating an example where a loading buffer and a loading picker operate. FIGS. 8A to 8D are side views schematically illustrating another example where a loading buffer and a loading picker operate. FIG. 9 is a front view schematically illustrating a loading unit, an unloading unit and a rotating unit. FIG. 10 is a diagram schematically illustrating a path through which a test tray is transferred between a loading unit, a rotation unit, and an unloading unit. FIG. 11 is a diagram schematically illustrating a path through which a test tray is transferred in a test handler according to an example embodiment of the present invention.

Reference numerals denoting test trays in FIGS. 10 and 11 may indicate a configuration of a test handler at which the test trays are located. The test trays indicated by dotted lines in FIG. 11 may show a transfer path of the test tray in a rotating unit and a chamber system and the test trays indicated by solid lines may show a transfer path of the test tray among the loading unit, the rotating unit, and the unloading unit.

As shown in FIG. 3, a test handler 1 according to an example embodiment of the present invention may include a loading unit 2, an unloading unit 3, a rotating unit 4, a chamber system 5, and a transferring unit.

The loading unit 2 may perform a loading process and may include a loading stacker 21, a loading picker 22 and a loading buffer 23.

The loading stacker 21 may store a plurality of user trays containing packaged chips to be tested.

The loading picker 22 may perform the loading process on a test tray T located at a loading position 2a. The test tray T may be located at the loading position 2a when the packaged chips to be tested are contained in the test tray T.

The loading picker 22 may move in or along an X axis direction and a Y axis direction and can ascend and/or descend. The loading picker 22 may include a first loading picker 221 and a second loading picker 222.

The first loading picker 221 may pick up the packaged chips to be tested from the user tray located in the loading stacker 21 and may provide the picked-up packaged chips to the loading buffer 23. The test handler 1 may include a plurality of first loading pickers 221.

In the user tray located in the loading stacker 21 and the test tray T, the packaged chips may be separated from each other with different gaps (in a form of a matrix). The gaps in an X axis direction and a Y axis direction between the packaged chips contained in the test tray T may be greater than the gaps in the X axis direction and the Y axis direction between the packaged chips contained in the user tray. This may be because the packaged chips contained in the test tray T may be connected to a hi-fix board in the chamber system 5.

To transfer and contain the packaged chips to be tested from the user tray to the test tray T, the loading picker 22 may adjust the gaps in the X axis direction and the Y axis direction between the packaged chips to be tested.

In order to reduce time of the process, the test handler 1 may include the loading buffer 23. The packaged chips contained in the loading buffer 23 and the test tray T may have the same gap in the Y axis direction. The packaged chips contained in the user tray located in the loading stacker 21 and contained in the loading buffer 23 may have the same gap in the X axis direction.

Accordingly, the first loading picker 221 may adjust the gap in the Y axis direction while transferring the packaged chips to be tested from the user tray located in the loading stacker 21 to the loading buffer 23. Thereafter, the second loading picker 222 may adjust the gap in the X axis direction while transferring the packaged chips to be tested from the loading buffer 23 to the test tray T.

Referring to FIGS. 3 to 4B, the first loading picker 221 may include a first nozzle unit 2211 and a first control unit 2212 to efficiently perform the loading process.

The first nozzle unit 2211 may suck and attach to the packaged chip. A plurality of first nozzle units may be provided in a first picker frame 221a of the first loading picker 221 to form a matrix. The first nozzle units 2211 may be provided in the first picker frame 221a to ascend and descend.

The first control unit 2212 may adjust the gap in a column direction (i.e., a direction of arrow Y) of the first nozzle units 2211. The column direction (i.e., the direction of arrow Y) may be parallel to the Y axis direction shown in FIG. 3. The first control unit 2212 may include a first guide plate 2212a and a first ascending/descending unit 2212b.

The first guide plate 2212a may be provided in the first picker frame 221a to ascend and descend. The first guide plate 2212a may have a rectangular plate shape, for example.

A plurality of first guide holes 2212c are formed in the first guide plate 2212a. The first nozzle units 2211 may be movably coupled to the first guide holes 2212c, respectively. Accordingly, the first guide plate 2212a can move to narrow or widen the gap between the first nozzle units 2211.

As shown in FIG. 4B, the first guide holes 2212c can be formed in the first guide plate 2212a to be tilted with different tilt angles.

The first ascending/descending unit 2212b may allow the first guide plate 2212a to ascend and descend. When the first ascending/descending unit 2212b allows the first guide plate 2212a to ascend and descend, the first nozzle units 2211 may move along the first guide holes 2212c to adjust the gap in the column direction (i.e., the direction of arrow Y).

As shown in FIG. 4A, when the first ascending/descending unit 2212b allows the first guide plate 2212a to ascend, the first nozzle units 2211 may move along the first guide holes 2212c to narrow the gap in the column direction (i.e., the direction of arrow Y). The narrowed gap in the column direction (i.e., the direction of arrow Y) between the first nozzle units 2211 may be equal to the gap in the Y axis direction (FIG. 3) between the packaged chips contained in the user tray located in the loading stacker 21.

In this case, the first nozzle units 2211 may be adjusted to have the same gaps as the gaps in the X axis direction and the Y axis direction (FIG. 3) between the packaged chips contained in the user tray.

As show in FIG. 4B, when the first ascending/descending unit 2212b allows the first guide plate 2212a to descend, the first nozzle units 2211 may move along the first guide holes 2212c to widen the gap in the column direction (i.e., the direction of arrow Y). The widened gap in the column direction (i.e., the direction of arrow Y) between the first nozzle units 2211 may be equal to the gap in the Y axis direction (FIG. 3) between the packaged chips contained in the loading buffer 23.

In this case, the first nozzle units 2211 may be adjusted to have the same gaps as the gaps in the X axis direction and the Y axis direction (FIG. 3) between the packaged chips contained in the loading buffer 23.

Accordingly, the first loading picker 221 may pick up a plurality of packaged chips in the unit of a matrix from the user tray located in the loading stacker 21 at a same time and can contain the picked-up packaged chips in the loading buffer 23 in the unit of the matrix at a same time.

Therefore, a time for the loading process may be reduced and efficiency of the loading process may be enhanced.

Referring to FIGS. 3 and 5, the second loading picker 222 may pick up the packaged chips to be tested from the loading buffer 23 and contain the picked-up packaged chips in the test tray T located at the loading position 2a.

The second loading picker 222 may partition the test tray T, located at the loading position 2a, into a plurality of containing areas and contain the packaged chips to be tested in the containing areas. The test handler 1 may include a plurality of second loading pickers 222.

The second loading picker 222 may include a second nozzle unit 2221 and a second control unit 2222.

The second nozzle units 2221 may suck and attach to the packaged chip and a plurality of second nozzle units 2221 may be provided in a second picker frame 222a of the second loading picker 222 to form a matrix. The second nozzle unit 2221 can be provided in the second picker frame 222a to ascend and descend.

The second control unit 2222 may adjust the gaps in a row direction (i.e., a direction of arrow X) between the second nozzle units 2221. The row direction (i.e., the direction of arrow N) may be parallel to the X axis direction shown in FIG. 3. The second control unit 2222 may include a second guide plate 2222a and a second ascending/descending unit 2222b.

The second guide plate 2222a may be provided in the second picker frame 222a to ascend and descend. The second guide plate 2222a can be formed in a rectangular plate shape, for example.

A plurality of second guide holes 2222c may be formed in the second guide plate 2222a. The second nozzle units 2221 may be movably coupled to the second guide holes 2222c, respectively. Accordingly, the second guide plate 2222a may allow the second nozzle units 2221 to move so as to narrow or widen the gaps between the second nozzle units 2221 with a same size.

The second guide holes 2222c may be obliquely formed in the second guide plate 2222a to be tilted with different tilt angles as shown in FIG. 5.

The second guide plate 2222a may be provided in the second picker frame 222a to be perpendicular to the first guide plate 2212a. Accordingly, the second loading picker 222 and the first loading picker 221 may adjust the gaps between the packaged chips to be tested in different directions of the column direction (i.e., the direction of arrow X) and the row direction (i.e., the direction of arrow Y).

The second ascending/descending unit 2222b may allow the second guide plate 2222a to ascend and descend. When the second ascending/descending unit 2222b allows the second guide plate 2222a to ascend and descend, the second nozzle units 2221 may move along the second guide holes 2222c to adjust the gap in the row direction (i.e., the direction of arrow X).

As shown in FIG. 5, when the second ascending/descending unit 2222b allows the second guide plate 2222a to descend, the second nozzle units 2221 may move along the second guide holes 2222c to narrow the gap in the row direction (i.e., the direction of arrow X). The narrowed gap in the row direction (i.e., the direction of arrow X) between the second nozzle units 2221 may be equal to the gap in the X axis direction (FIG. 3) between the packaged chips contained in the loading buffer 23.

In this case, the second nozzle units 2211 may be adjusted to have the same gaps as the gaps in the X axis direction and the Y axis direction (FIG. 3) between the packaged chips contained in the loading buffer 23.

Although not shown, when the second ascending/descending unit 2222b allows the second guide plate 2222a to ascend, the second nozzle units 2221 may move along the second guide holes 2222c to widen the gap in the row direction (i.e., the direction of arrow X). The widened gap in the row direction (i.e., the direction of arrow X) between the second nozzle units 2221 may be equal to the gap in the X axis direction (FIG. 3) between the packaged chips contained in the test tray T located at the loading position 2a.

In this case, the second nozzle units 2211 may be adjusted to have the same gaps as the gaps in the X axis direction and the Y axis direction (FIG. 3) between the packaged chips contained in the test tray T located at the loading position 2a.

Accordingly, the second loading picker 222 may pick up a plurality of packaged chips to be tested from the loading buffer 23 at a same time and can contain the picked-up packaged chips in the test tray T in the unit of a matrix at a same time.

As a result, a time for the loading process may be reduced and efficiency of the loading process may be enhanced.

Referring to FIGS. 4A to 5, the test handler 1 may be embodied so that the packaged chips to be tested are provided in the loading buffer 23 and the test tray T to have the same gap in the X axis direction and are provided in the user tray located in the loading stacker 21 and the loading buffer 23 to have the same gap in the Y axis direction.

In this case, the first loading picker 221 may include the first control unit 2212 to adjust the gap in the row direction (i.e., the direction of arrow X in FIG. 5) between the first nozzle units 2211. The second loading picker 222 may include the second control unit 2222 to adjust the gap in the column direction (i.e., the direction of arrow Y in FIG. 5) between the second nozzle units 2221.

Referring to FIGS. 3 and 6, the loading buffer 23 may move in or along the Y axis direction and may temporarily contain the packaged chips to be tested. The loading buffer 23 can move in or along the X axis direction and the Y axis direction. The test handler 1 may include a plurality of loading buffers 23.

Although not shown, the loading buffer 23 may be coupled to a belt that connects a plurality of pulleys and that can move based on rotation of at least one pulley.

Figure 7A:
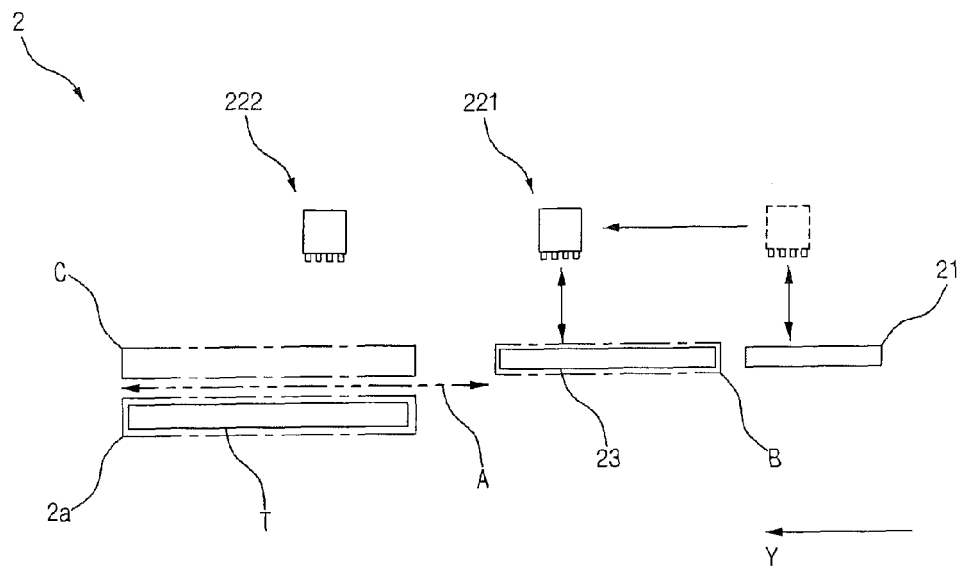
FIGS. 7A to 7D are side views schematically illustrating an example where a loading buffer and a loading picker operate.

Referring to FIGS. 6 and 7A, the loading buffer 23 may be movable along a loading moving path A formed over the loading position 2a. The loading buffer 23 can move over the test tray T located at the loading position 2a. The loading moving path A may be a path along which the loading buffer 23 may move to an area (i.e., an area B in FIG. 7A) between the user tray located in the loading stacker 21 and the loading position 2a and an area (i.e., an area C in FIG. 7A) between the user tray and the test tray T located at the loading position 2a.

The loading buffer 23 may be movably coupled to a guide rail 23a. The guide rail 23a may guide the loading buffer 23 to move along the loading moving path A.

The loading buffer 23 may move along the loading moving path A to reduce a moving distance of the second loading picker 222 when the second loading picker 222 performs the loading process.

The loading buffer 23 may move along the loading moving path A to overlap with the loading position 2a. By allowing the loading buffer 23 to move to the test tray T located at the loading position 2a, the moving distance of the second loading picker 222 may be reduced at a time of performing the loading process.

Accordingly, a time for the loading process may be further reduced and efficiency of the loading process may be further enhanced.

An example of the loading buffer 23 and the loading picker 22 operating may now be described with reference to FIGS. 7A to 7D.

The loading buffer 23 may move along the loading moving path A to transfer the packaged chips to be tested to another containing area that is adjacent to a containing area where the second loading picker 222 may contain the packaged chips to be tested in the test tray T located at the loading position 2a.

The containing area may represent a matrix unit by which the second loading picker 222 can contain the packaged chips to be tested at a same time and may be equal to the matrix unit of a plurality of packaged chips that can be sucked and attached (or fixed) to the second nozzle units 2221 at a same time.

As shown in FIG. 7A, when the loading buffer 23 is located in an area (i.e., the area B) between the user tray located in the loading stacker 21 and the loading position 2a, the first loading picker 221 provides the packaged chips to be tested to the loading buffer 23. After the packaged chips to be tested are contained in the loading buffer 23, the loading buffer 23 may move along the loading moving path A.

Figure 7B:
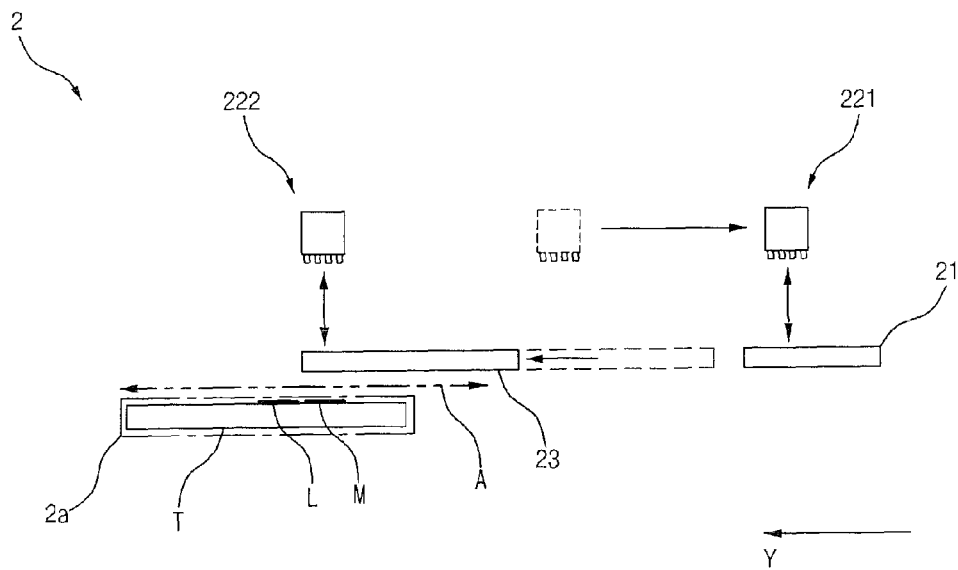

As shown in FIG. 7B, the loading buffer 23 may transfer the packaged chips to be tested so that the packaged chips contained therein are located in another containing area M that is adjacent to the containing area L where the second loading picker 222 contains the packaged chips in the test tray T located at the loading position 2a.

Figure 7C:
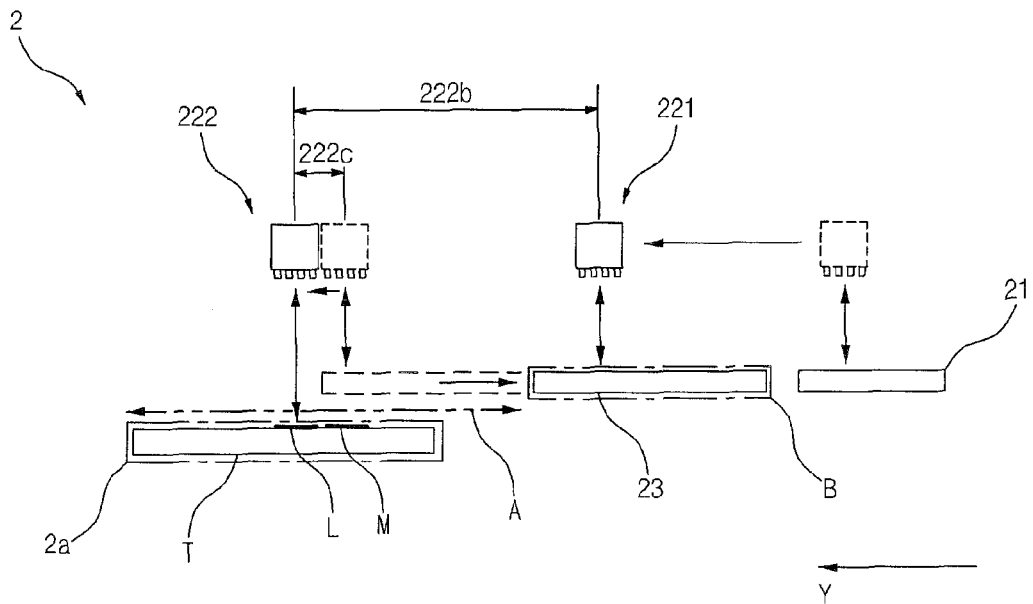

As shown in FIG. 7C, the second loading picker 222 may pick up the packaged chips from the loading buffer 23, move to the corresponding containing area L by a predetermined distance 222c, and then contain the packaged chips in the test tray T located at the loading position 2a.

Accordingly, the second loading picker 222 may move by the distance 222c that is less than the moving distance 222b when the loading buffer 23 is located in the area (i.e., the area B) between the user tray located in the loading stacker 21 and the loading position 2a and can perform the loading process. As a result, a time for the loading process may be reduced.

The loading buffer 23 may move to the area (i.e., the area B) between the user tray located in the loading stacker 21 and the loading position 2a while the second loading picker 222 is containing the packaged chips to be tested in the test tray T located at the loading position 2a.

Accordingly, the first loading picker 221 may contain new packaged chips to be tested in the loading buffer 23 while the second loading picker 222 is containing the packaged chips in the test tray T located at the loading position 2a. As a result, a time for the loading process may be further reduced and efficiency of the loading process may be further enhanced.

Figure 7D:
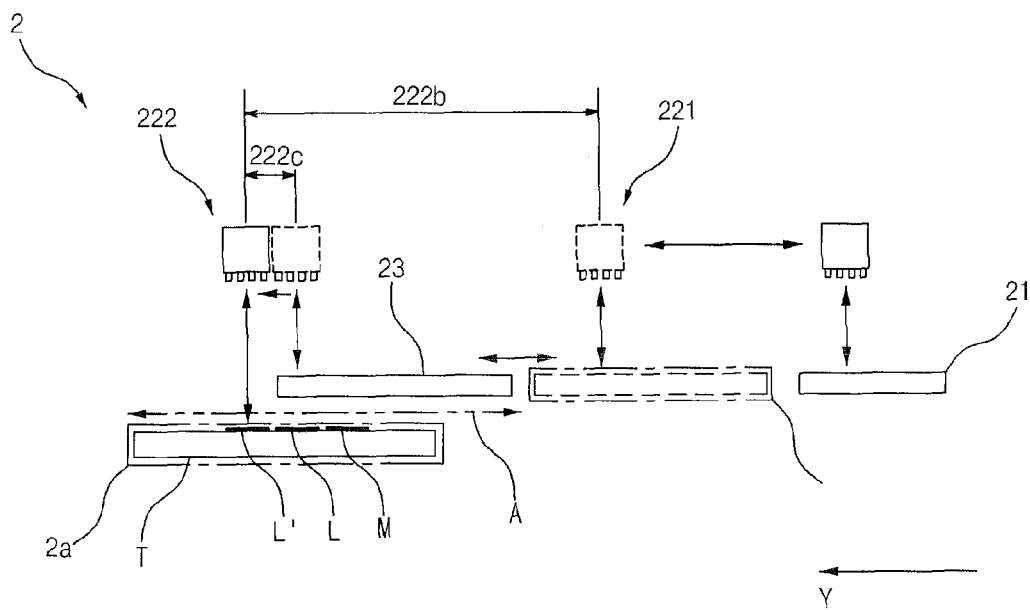

As shown in FIG. 7D, the loading buffer 23 may transfer the packaged chips to be tested so that the packaged chips contained therein are located in another containing area L that is adjacent to the containing area L' where the second loading picker 222 contains the packaged chips in the test tray T located at the loading position 2a.

The second loading picker 222 may pick up the packaged chips from the loading buffer 23, move to the corresponding containing area L' by a predetermined distance 222c, and then contain the packaged chips in the test tray T located at the loading position 2a.

As described above, the loading buffer 23 may transfer the packaged chips contained therein to the containing area L, L' or M that is most adjacent to the containing area L, L' or M where the second loading picker 222 contains the packaged chips to be tested.

That is, when the containing area L, L' or M where the second loading picker 222 contains the packaged chips to be tested in the test tray T located at the loading position is changed, the loading buffer 23 may transfer the packaged chips to be tested to the containing area (L, L' or M) that is most adjacent to the corresponding containing area L, L' or M.

Accordingly, regardless of positions of the containing areas L, L' and M, a distance by which the second loading picker 222 moves to perform the loading process may be reduced.

Another example where the loading buffer 23 and the loading picker 22 operate may now be described with reference to FIGS. 8A to 8D.

The loading buffer 23 may move along the loading moving path A to transfer the packaged chips to be tested to the containing area where the second loading picker 222 contains the packaged chips in the test tray T located at the loading position 2a.

Figure 8A:
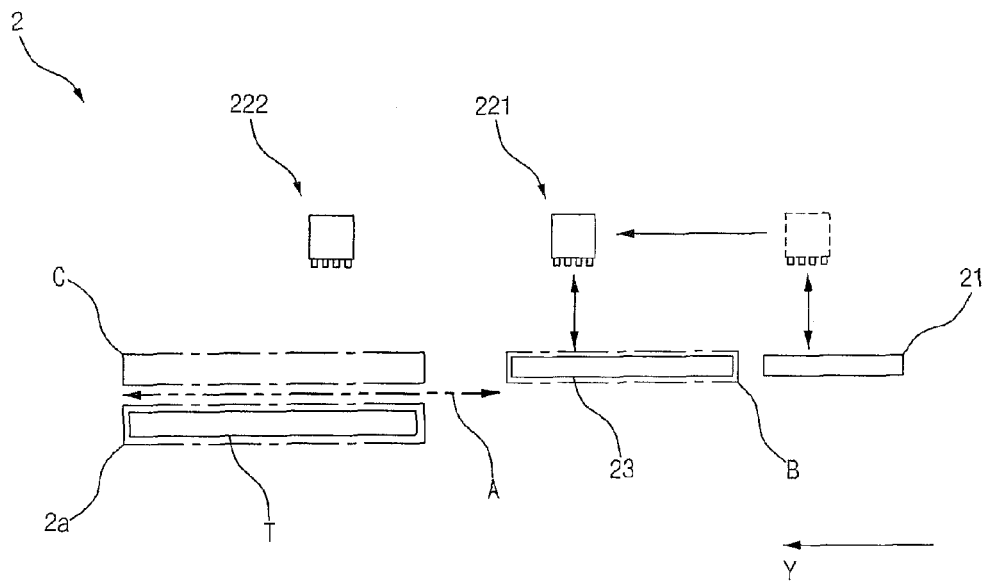
FIGS. 8A to 8D are side views schematically illustrating another example where a loading buffer and a loading picker operate.

As shown in FIG. 8A, when the loading buffer 23 is located in the area (i.e., the area B) between the user tray located in the loading stacker 21 and the loading position 2a, the first loading picker 221 may provide the packaged chips to be tested to the loading buffer 23. After the packaged chips to be tested are contained in the loading buffer 23, the loading buffer 23 may move along the loading moving path A.

Figure 8B:
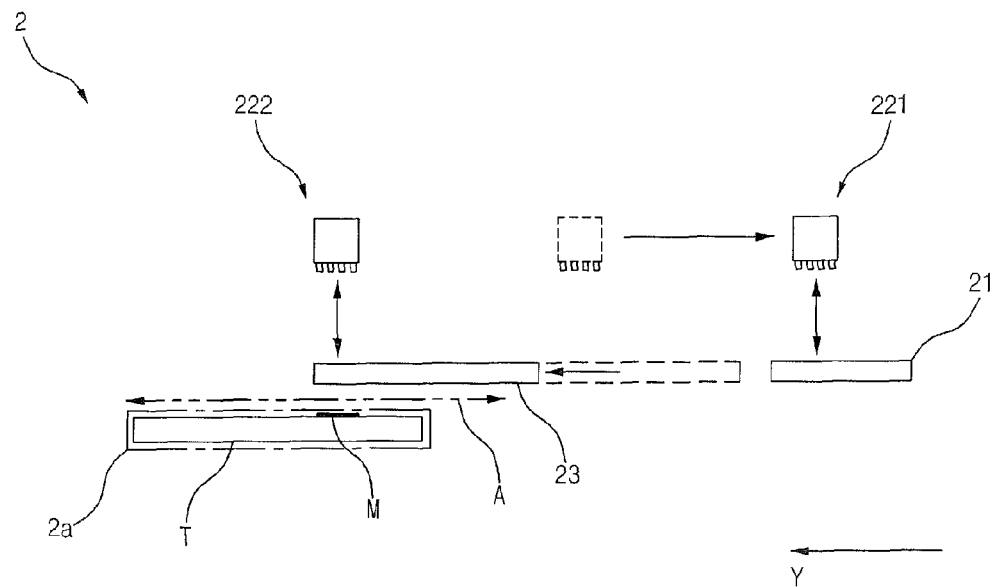

As shown in FIG. 8B, the loading buffer 23 may transfer the packaged chips to be tested so that the packaged chips contained therein are located in the containing area M where the second loading picker 222 contains the packaged chips in the test tray T located at the loading position 2a.

Figure 8C:
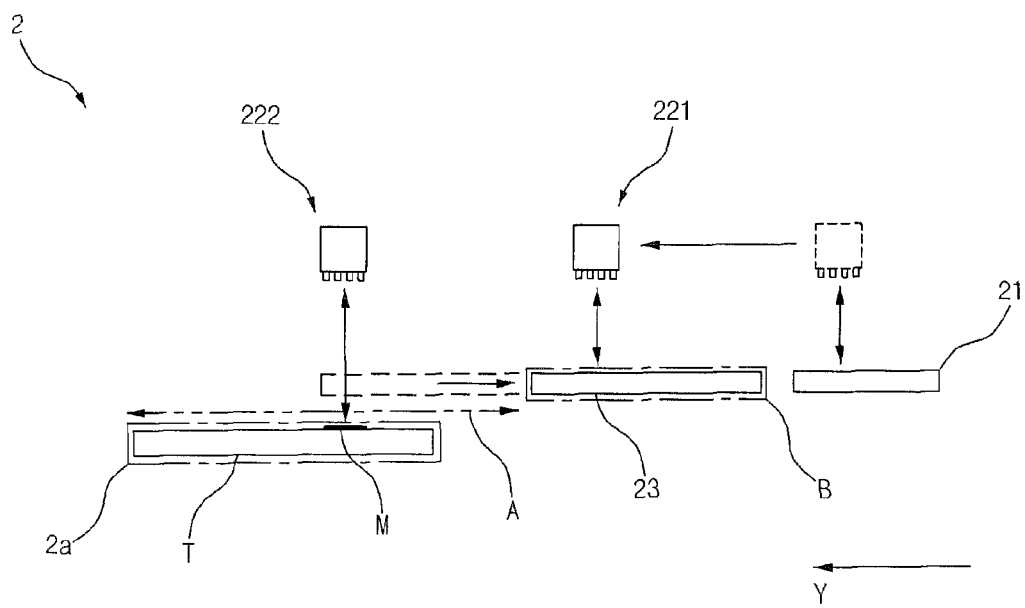

As shown in FIG. 8C, when the second loading picker 222 picks up the packaged chips to be tested from the loading buffer 23, the loading buffer 23 may move to the area (i.e., the area B) between the user tray located in the loading stacker 21 and the loading position 2a.

When the loading buffer 23 departs from the containing area M, the second loading picker 222 may move to the containing area M and may contain the packaged chips in the test tray T located at the loading position 2a.

Accordingly, the second loading picker 222 may move by the distance that is less than the moving distance when the loading buffer 23 is located in the area (i.e., the area B) between the user tray located in the loading stacker 21 and the loading position 2a and may perform the loading process. As a result, the time for the loading process may be reduced.

The first loading picker 221 may contain new packaged chips to be tested in the loading buffer 23 while the second loading picker 222 is containing the packaged chips in the test tray T located at the loading position 2a. As a result, a time for the loading process may be further reduced and efficiency of the loading process may be further enhanced.

Figure 8D:
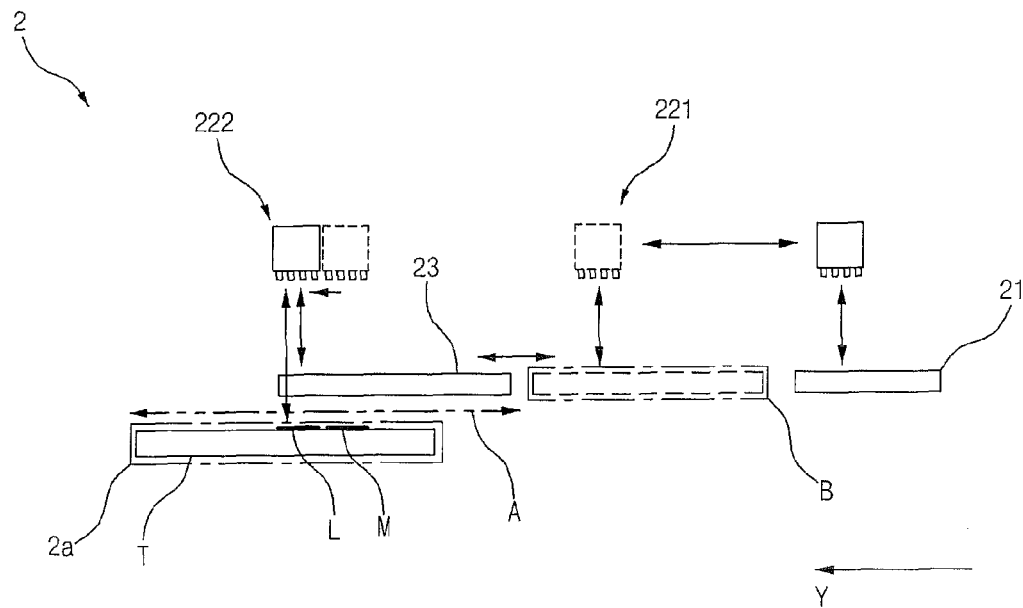

As shown in FIG. 8D, when the loading process is finished in the corresponding containing area M, the second loading picker 222 may move to a different containing area L that is adjacent thereto.

Thereafter, the loading buffer 23 can transfer the packaged chips to be tested so that the packaged chips contained therein are located above a different containing area L than where the second loading picker 222 contains the packaged chips in the test tray T located at the loading position 2a.

When the second loading picker 222 picks up the packaged chips to be tested from the loading buffer 23, the loading buffer 23 may move to the area (i.e., the area B) between the user tray located in the loading stacker 21 and the loading position 2a. When the loading buffer 23 departs from the containing area L, the second loading picker 222 may move to the containing area L and contains the packaged chips in the test tray T located at the loading position 2a.

As described above, the loading buffer 23 may transfer the packaged chips to be tested so that the packaged chips contained therein are located above the containing area M or L where the second loading picker 222 contains the packaged chips in the test tray T located at the loading position 2a.

That is, when the containing area M or L where the second loading picker 222 contains the packaged chips in the test tray T located at the loading position is changed, the loading buffer 23 may transfer the packaged chips to the corresponding containing area M or L.

Accordingly, regardless of positions of the containing areas M and L, the distance by which the second loading picker 222 moves to perform the loading process may be reduced.

Referring to FIGS. 9 and 10, the loading unit 2 may further include a loading ascending/descending system 24.

The loading ascending/descending system 24 may allow the test tray T to ascend and descend along a first ascending/descending path E formed among the loading position 2a, a first arriving position 2b and a first departing position 2c. The loading position 2a, the first arriving position 2b, and the first departing position 2c may be arranged sequentially from top to bottom (in the direction of arrow N) along the first ascending/descending path E.

The first arriving position 2b may be an arriving position of the test tray T transferred from the unloading unit 3. The test tray T transferred from the unloading unit 3 may be a test tray T having been subjected to the unloading process and the test tray T may wait at the first arriving position 2b before moving to the loading position 2a.

The first departing position 2c may be a position where the test tray T having been subjected to the loading process departs for the rotating unit 4. The test tray T having been subjected to the loading process may wait at the first departing position 2c before moving to the rotating unit 4. The first departing position 2c may be flush (or level or even) with the rotating unit 4.

The loading ascending/descending system 24 may include a loading supporting member 241 and a loading ascending/descending unit 242.

The loading supporting member 241 may support the test tray T and may ascend and descend along the first ascending/ descending path E based on the loading ascending/descending unit 242. The loading supporting member 241 may contact a bottom of the test tray T to support the test tray T.

The loading supporting member 241 may be formed open in the direction (i.e., a direction of arrow P in FIG. 9) from the loading unit 2 to the unloading unit 3. Accordingly, the test tray T may be transferred from the first departing position 2c to the rotating unit 4 and the test tray T may be transferred from the unloading unit 3 to the first arriving position 2b without interference with the loading supporting member 241.

The loading ascending/descending unit 242 may allow the loading supporting member 241 to ascend and descend. The loading ascending/descending unit 242 may allow the loading supporting member 241 to move along the first ascending/descending path E. The loading supporting member 241 may ascend and descend among the loading position 2a, the first arriving position 2b, and the first departing position 2c based pm the loading ascending/descending unit 242.

The loading ascending/descending unit 242 may include a plurality of cylinders and rods that move based on the cylinders. The loading supporting member 241 may be coupled to the rods and may ascend and descend with movement of the rods by the cylinders. The cylinders may be hydraulic cylinders or pneumatic cylinders, for example.

Referring to FIG. 3, the unloading unit 3 may perform the unloading process and may be provided aside the loading unit 2. The unloading unit 3 may include an unloading stacker 31, an unloading picker 32 and an unloading buffer 33.

The unloading stacker 31 may store a plurality of user trays that contain tested packaged chips. The tested packaged chips may be contained in different user trays located at different positions by grades in the unloading stacker 31 based on the test result.

The unloading picker 32 may perform the unloading process on the test tray T located at an unloading position 3a. The test tray T is located at the unloading position 3a when the tested packaged chips contained therein from the test tray T.

The unloading picker 32 may move in or along the X axis direction and the Y axis direction (FIG. 3) and can ascend and descend. The unloading picker 32 may include nozzles sucking and attaching to the packaged chips. The unloading picker 32 may include a first unloading picker 321 and a second unloading picker 322.

The first unloading picker 321 may pick up the tested packaged chips from the unloading buffer 33 and provide the picked-up packaged chips in the user tray located in the unloading stacker 31. The test handler 1 may include a plurality of first unloading pickers 321.

The first unloading picker 321 may include a control unit to adjust the gap in the row direction or the column direction of the nozzles, in a manner similar to the first loading picker 221.

The second unloading picker 322 may separate the tested packaged chips from the test tray T located at the unloading position 3a and provide the separated packaged chips to the unloading buffer 33. The test tray T may be located at the unloading position 3a when the tested packaged chips are separated therefrom. The test handler 1 may include a plurality of second unloading pickers 322.

The second unloading picker 322 may include a control unit to adjust the gap in the column direction or the row direction of the nozzles, in a manner similar to the second loading picker 222. In the nozzles provided in the second unloading picker 322, the gap in a direction different from the direction in which the gap of the nozzles provided in the first unloading picker 321 may be adjusted in the row direction and the column direction.

Referring to FIGS. 3 and 6, the unloading buffer 33 may move in or along the Y axis direction and may temporarily contain the tested packaged chips. The test handler 1 may include a plurality of unloading buffers 33. The unloading buffer 33 may be provided between the loading position 2a and the unloading position 3a.

Referring to FIGS. 9 and 10, the unloading unit 3 may further include an unloading ascending/descending system 34. The unloading ascending/descending system 34 may allow the test tray T to ascend and descend along a second ascending/descending path F formed among the unloading position 3a, a second departing position 3b, and a second arriving position 3c. The unloading position 3a, the second departing position 3b, and the second arriving position 3c may be arranged from top to bottom (i.e., in a direction of arrow N) along the second ascending/descending path F.

The second departing position 3b may be a position where the test tray T having been subjected to the unloading process departs for the first arriving position 2b. The test tray T having been subjected to the unloading process may wait at the second departing position 3b before being transferred to the first arriving position 2b. The second departing position 3b may be flush (or level or even) with the first arriving position 2b.

The second arriving position 3c may be arriving position of the test tray T transferred from the rotating unit 4. The test tray T transferred from the rotating unit 4 may be a test tray T containing the tested packaged chips and the test tray T may wait at the second arriving position 3c before being transferred to the unloading position 3a. The second arriving position 3c may be flush (or level or even) with the rotating unit 4 and the first departing position 2c.

The unloading ascending/descending system 34 may include an unloading supporting member 341 and an unloading ascending/descending unit 342.

The unloading supporting member 341 may support the test tray T and may ascend and descend along the second ascending/descending path F based on the unloading ascending/descending unit 342. The unloading supporting member 341 may contact a bottom of the test tray T to support the test tray T.

The unloading supporting member 341 may be formed open in a direction (i.e., a direction of arrow P in FIG. 9) from the unloading unit 3 to the loading unit 2. Accordingly, the test tray T may be transferred from the second departing position 3b to the first arriving position 2b and may be transferred from the rotating unit 4 to the second arriving position 3c without interference with the unloading supporting member 3b.

The unloading ascending/descending unit 342 may allow the unloading supporting member 341 to ascend and descend. The unloading ascending/descending unit 341 may allow the unloading supporting member 341 to ascend and descend along the second ascending/descending path F. The unloading supporting member 341 may ascend and descend among the unloading position 3a, the second departing position 3b, and the second arriving position 3c based on the unloading ascending/descending unit 342.

The unloading ascending/descending unit 342 may include a plurality of cylinders and rods that move based on the cylinders. The unloading supporting member 341 may be coupled to the rods to ascend and descend based on movement of the rods by the cylinders. The cylinders may be hydraulic cylinders or pneumatic cylinders, for example.

As described above, since the test handler performs the loading process and the unloading process at different positions, the loading process and the unloading process may be simplified. Accordingly, an error occurrence frequency in the loading process and the unloading process may be reduced in half, and one process of the loading process and the unloading process may be normally performed even when an error occurs in the other process. As a result, efficiency of the loading process and the unloading process may be enhanced.

By allowing the test tray T to ascend and descend in the loading unit 2 and the unloading unit 3, a length 1L (FIG. 3) of the test handler 1 may be reduced.

Referring to FIGS. 8 and 11, the rotating unit 4 may rotate the test tray T transferred from the loading unit 2 from a horizontal posture (or horizontal position) to a vertical posture (or vertical position). The test tray T rotated to the vertical posture by the rotating unit 4 may be transferred from the rotating unit 4 to the chamber system 5. The rotating unit 4 may rotate the test tray T transferred from the chamber unit 5 from the vertical posture to the horizontal posture. The test handler 1 may include a plurality of rotating units 4.

The test handler 1 may perform the loading process and the unloading process on the test tray T in the vertical posture and may perform the testing process on the test tray T in the vertical posture.

Although not shown, the rotating unit 4 may include a plurality of pulleys, a belt that connects the pulleys, and transferring means coupled to the belt to transfer the test tray T by pushing or pulling the test tray T. The transferring means may be provided in the chamber system 5.

The rotating unit 4 can be provided between the first departing position 2c and the second arriving position 3c. The rotating unit 4 can be flush (or level or even) with the first departing position 2c and the second arriving position 3c.

Referring to FIGS. 3 and 11, the chamber system 5 may include a first chamber 51, a second chamber 52 and a third chamber 53 for the tester to test packaged chips under environments of high temperature, low temperature and normal temperature.

The first chamber 51 may adjust the packaged chips contained in the test tray T to the testing temperature. The test tray T containing the packaged chips to be tested may be a test tray T transferred from the rotating unit 4.

The first chamber 51 may include at least one of an electric heater and a liquefied nitrogen injecting apparatus to adjust the packaged chips to be tested to the testing temperature. The first chamber 51 can allow the test tray T having the vertical posture to move therein.

When the packaged chips to be tested are adjusted to the testing temperature, the test tray T may be transferred from the first chamber 51 to the second chamber 52.

The second chamber 52 may connect the packaged chips adjusted to the testing temperature and contained in the test tray T to the hi-Fx board H. The second chamber 52 may include a contact unit 521 that connects the packaged chips adjusted to the testing temperature to the hi-fix board H, where a part or all of the hi-fix board H may be inserted into the contact unit 521. The tester may test the packaged chips to determine electrical characteristics of the packaged chips connected to the hi-fix board H.

The second chamber 52 may include at least one of an electric heater and a liquefied nitrogen injecting apparatus to maintain the packaged chips to be tested at the testing temperature. The test handler 1 may include a plurality of second chambers 52 and the hi-fix board H may be separately disposed in each of the second chambers 52.

When the packaged chips are completely subjected to the testing process, the test tray T may be transferred from the second chamber 52 to the third chamber 53.

The third chamber 53 may restore the tested packaged chips contained in the test tray T to the normal temperature.

The third chamber 53 may include at least one of an electric heater and a liquefied nitrogen injecting apparatus to restore the tested packaged chips to the normal temperature. The third chamber 53 may allow the test tray T having the vertical posture to move therein.

When the tested packaged chips are restored to the normal temperature or a temperature close to the normal temperature, the test tray T may be transferred from the third chamber 53 to the rotating unit 4.

As shown in FIG. 11, the first chamber 51, the second chamber 52 and the third chamber 53 may be arranged in the vertical direction. A plurality of the second chambers 52 may be vertically stacked.

Although not shown, the first chamber 51, the second chamber 52 and the third chamber 53 may be vertically stacked. In this case, the first chamber 51 may be disposed above the second chamber 52 and the third chamber 53 may be disposed below the second chamber 52.

The transferring unit may transfer the test tray T. Although not shown, the transferring unit may include a plurality of pulleys, a belt that connects the pulleys, and a moving member coupled to the belt to transfer the test tray T by pushing or pulling the test tray.

Referring to FIG. 10, the transferring unit may include a first transferring unit 61, a second transferring unit 62 and a third transferring unit 63.

The first transferring unit 61 may transfer the test tray T containing the tested packaged chips from the rotating unit 4 to the second arriving position 3c.

The second transferring unit 62 may transfer the test tray T having been subjected to the loading process from the first departing position 2c to the rotating unit 4.

The third transferring unit 63 may transfer the test tray T having been subjected to the unloading process from the second departing position 3b to the first arriving position 2b.

A packaged chip loading method according to an example embodiment of the present invention may now be described.

Referring to FIGS. 3 to 11, a packaged chip loading method according to an example embodiment may have the following configuration.

The first loading picker 221 may pick up the packaged chips to be tested from the user tray located in the loading stacker 21 and contain the picked-up packaged chips in the loading buffer 23. This may be performed by allowing the first loading picker 221 to pick up the packaged chips to be tested from the user tray located in the loading stacker 21 and to contain the picked-up packaged chips in the loading buffer 23 in a state where the loading buffer 23 is located in the area (i.e., the area B in FIG. 7A) between the user tray located in the loading stacker 21 and the loading position 2a.

The loading buffer 23 may move along the loading moving path A and may be located above the test tray T located at the loading position 2a. This may be performed by allowing the loading buffer 23 to move along the loading moving path A so as to be located in the area (i.e., the area C in FIG. 7A) above the test tray T located at the loading position 2a.

The second loading picker 222 may pick up the packaged chips to be tested from the loading buffer 23. This may be performed by allowing the second loading picker 222 to pick up the packaged chips to be tested from the loading buffer 23 in a state where the loading buffer 23 is located to the area (i.e., the area C in FIG. 7A) above the test tray T located at the loading position 2a.

The loading buffer 23 may move along the loading moving path A up to the position where the first loading picker 221 can contain the packaged chips to be tested in the loading buffer 23. This may be performed by allowing the loading buffer 23 to move along the loading moving path A up to the area (i.e., area B in FIG. 7A) between the user tray located in the loading stacker 21 and the loading position 2a.

The second loading picker 222 may partition the test tray T located at the loading position 2a into a plurality of containing areas and contain the packaged chips to be tested in the containing areas. This may be performed by allowing the second loading picker 222 to move in or along the X axis direction and the Y axis direction and to ascend and descend so as to contain the packaged chips picked up from the loading buffer 23 in the test tray T located at the loading position 2a.

This may be also performed at a same time as allowing the first loading picker 221 to pick up the packaged chips from the user tray and to contain the picked-up packaged chips in the loading buffer 23. Accordingly, the time for the loading process may be reduced and efficiency of the loading process may be enhanced.

Referring to FIGS. 3 to 11, allowing the first loading picker 221 to pick up the packaged chips from the user tray and to contain the picked-up packaged chips in the loading buffer 23 may further include the following.

The gap in the row direction (i.e., the direction of arrow X in FIG. 5) or the column direction (i.e., the direction of arrow Y in FIG. 4A) of the first nozzle units 2211 of the first loading picker 221 may be narrowed.

This may be performed by allowing the first control unit 2212 to narrow the gap in the row direction (i.e., the direction of arrow X in FIG. 5) or the column direction (i.e., direction of arrow Y in FIG. 4A) of the first nozzle units 2211. The gaps between the first nozzle units 2211 may be narrowed by a same distance by the first guide plate 2212a.

Accordingly, gaps between the first nozzle units 2211 may be adjusted to the same gaps as the gaps in the X axis direction and the Y axis direction (see FIG. 3) of the packaged chips contained in the user tray located in the loading stacker 21.

The first loading picker 221 may pick up the packaged chips from the user tray located in the loading stacker 21 by use of the first nozzle units 2211 of which the gaps are narrowed.

This may include allowing the first loading picker 221 to descend, allowing the first nozzle units 2211 to suck and attach to the packaged chips contained in the user tray located in the loading stacker 21, and allowing the first loading picker 221 to ascend.

The first loading picker 221 may pick up a plurality of packaged chips to be tested from the user tray located in the loading stacker 21 at a same time in the matrix unit. Accordingly, the time for the loading process may be reduced and efficiency of the loading process may be enhanced.

The gap in the row direction (i.e., the direction of arrow X in FIG. 5) or the column direction (i.e., the direction of arrow Y in FIG. 4A) of the first nozzle units 2211 sucking and attaching to the packaged chips to be tested may be widened.

This may be performed by allowing the first control unit 2212 to widen the gap in the row direction (i.e., the direction of arrow X in FIG. 5) or the column direction (i.e., the direction of arrow Y in FIG. 4A) of the first nozzle units 2211. The gaps between the first nozzle units 2211 may be widened by the same distance by the first guide plate 2212a.

The gaps between the first nozzle units 2211 may be adjusted to the same gaps in the X axis direction and the Y axis direction (FIG. 3) between the packaged chips contained in the loading buffer 23. This may be performed by allowing the first loading picker 221 having picking up the packaged chips to be tested to move to the position where the loading buffer 23 is located.

The first loading picker 221 may contain the packaged chips to be tested in the loading buffer 23 by use of the first nozzle units 2211 of which the gaps are widened.

This may include allowing the first loading picker 221 to descend, allowing the first nozzle units 2211 to release the packaged chips to be tested, and allowing the first loading picker 221 to ascend.

The first loading picker 221 may contain a plurality of packaged chips in the loading buffer 23 at a same time in the matrix unit. Accordingly, a time for the loading process may be reduced and efficiency of the loading process may be enhanced.

Referring to FIGS. 3 to 11, allowing the loading buffer 23 to move along the loading moving path A up to the area above the test tray T located at the loading position 2a may include the following.

The loading buffer 23 may move along the loading moving path A so that the packaged chips contained in the loading buffer 23 are located above the different containing area that is adjacent to the containing area where the second loading picker 222 contains the packaged chips to be tested in the test tray T located at the loading position 2a.

As shown in FIGS. 7A to 7D, this may be performed by allowing the loading buffer 23 to move along the loading moving path A.

The packaged chips contained in the loading buffer 23 may be located above the different containing area L, L' or M that is most adjacent to the containing area L, L' or M where the second loading picker 222 contains the packaged chips to be tested in the test tray T located at the loading position 2a.

When the containing area L, L' or M where the second loading picker 222 contains the packaged chips in the test tray T located at the loading position 2a is changed, the loading buffer 23 may transfer the packaged chips to the different containing area L, L' or M that is most adjacent to the corresponding containing area L, L' or M.

As shown in FIGS. 7A to 7D, the second loading picker 222 may pick up the packaged chips to be tested from the loading buffer 23, move to the corresponding containing area L' by a predetermined distance 222c, and then contain the packaged chips in the test tray T located at the loading position 2a.

Accordingly, regardless of positions of the containing areas L, L' and M, the distance by which the second loading picker 222 moves to perform the loading process may be reduced.

Referring to FIGS. 3 to 11, allowing the loading buffer 23 to move along the loading moving path A up to the area above the test tray T located at the loading position 2a may further include the following.

The loading buffer 23 may move along the loading moving path A so that the packaged chips contained in the loading buffer 23 are located above the containing area M or L where the second loading picker 222 contains the packaged chips to be tested in the test tray T located at the loading position 2a.

As shown in FIGS. 8A to 8D, this may be performed by allowing the loading buffer 23 to move along the loading moving path A.

The packaged chips contained in the loading buffer 23 may be located above the containing area M or L where the second loading picker 222 contains the packaged chips in the test tray T located at the loading position 2a.

When the containing area M or L where the second loading picker 222 contains the packaged chips to be tested in the test tray T located at the loading position 2a is changed, the loading buffer 23 may transfer the packaged chip to the area above the corresponding containing area M or L.

As shown in FIGS. 8A to 8D, when the loading buffer 23 departs from the containing area L, the second loading picker 222 may move to the containing area L and contain the packaged chips in the test tray T located at the loading position 2a.

Accordingly, regardless of positions of the containing areas M and L, the distance by which the second loading picker 222 moves to perform the loading process may be reduced.

Referring to FIGS. 3 to 11, allowing the second loading picker 23 to partition the test tray T located at the loading position into a plurality of containing areas and to contain the packaged chips in the plurality of containing areas may further include the following.

As shown in FIGS. 8A to 8D, the second loading picker 23 may move to the area above the different containing area L that is adjacent to the containing area M where the second loading picker 23 contains the packaged chips in the test tray T located at the loading position 2a.

The second loading picker 222 may contain the packaged chips to be tested in the test tray T located at the loading position 2a sequentially by the containing areas M and L.

When the containing area M or L where the second loading picker 222 contains the packaged chips in the test tray T located at the loading position 2a is changed, the loading buffer 23 may transfer the packaged chips to the area above the corresponding containing area M or L. Accordingly, regardless of positions of the containing areas M and L, the distance by which the second loading picker 222 moves to perform the loading process may be reduced.

A test tray transferring method according to an example embodiment may now be described with reference to FIGS. 3-11.

The loading process may be performed on the test tray T located at the loading position 2a where the test tray is located at the time of containing the packaged chips to be tested in the test tray T, by use of the packaged chip loading method.

This may be performed by actuating the first loading picker 221, the second loading picker 222, and the loading buffer 23 by use of the packaged chip loading method.

The test tray T having been subjected to the loading process may descend from the loading position 2a to the first departing position 2c below the loading position 2a, and may then be transferred to the rotating unit 4.

This may be performed by allowing the loading ascending/descending system 24 to move the test tray T having been subjected to the loading process down from the loading position 2a to the first departing position 2c and allowing the second transferring unit 62 to transfer the test tray T having been subjected to the loading process from the first departing position 2c to the rotating unit 4.

The test tray T located in the rotating unit 4 and having been subjected to the loading process may be rotated from the horizontal posture to the vertical posture and may then be transferred from the rotating unit 4 to the chamber system 5.

This may be performed by allowing the rotating unit 4 to rotate the test tray T having been subjected to the loading process from the horizontal posture to the vertical posture and allowing the transferring means disposed in the rotating unit 4 or the chamber system 5 to transfer the test tray T rotated to the vertical posture from the rotating unit 4 to the first chamber 51.

In the chamber system 5, the packaged chips contained in the test tray T may be adjusted to the testing temperature, the packaged chips adjusted to the testing temperature may be connected to the hi-fix board H for testing, and the tested packaged chips may be restored to the normal temperature.

This may be performed by allowing the first chamber 51 to adjust the packaged chips contained in the test tray T to the testing temperature, allowing the first chamber 51 to connect and test the packaged chips adjusted to the testing temperature to the hi-fix board H, and allowing the third chamber 53 to restore the tested packaged chips to the normal temperature. The test tray T may be transferred to the first chamber 51, the second chamber 52, and the third chamber 53.

The test tray T containing the tested packaged chips may be transferred from the chamber system 5 to the rotating unit 4 and may then be rotated from the vertical posture to the horizontal posture.

This may be performed by allowing the transferring means disposed in the rotating unit 4 or the chamber system 5 to transfer the test tray T containing the tested packaged chips from the third chamber 53 to the rotating unit 4 and allowing the rotating unit 4 to rotate the test tray T containing the tested packaged chips from the vertical posture to the horizontal posture.

The test tray T containing the tested packaged chip and located in the rotating unit 4 may be transferred to the second arriving position 3c below the unloading position 3a where the test tray T is located at the time of separating the tested packaged chips from the test tray T and may then ascend to the unloading position 3a.

This may be performed by allowing the first transferring unit 61 to transfer the test tray T containing the tested packaged chips from the rotating unit 4 to the second arriving position 3c and allowing the unloading ascending/descending system 34 to move the test tray T containing the tested packaged chips up from the second arriving position 3c to the unloading position 3a.

The unloading process may then be performed on the test tray T located at the unloading position 3a.

This may be performed by allowing the unloading picker 32 to separate the tested packaged chips from the test tray T located at the unloading position 3a and to contain the separated packaged chips in the user tray located in the unloading stacker 31 through the unloading buffer 33.

The tested packaged chips may be contained in the user trays located at different positions by grades in the unloading stacker 31 based on the test result by the unloading picker 32.

The test tray T having been subjected to the unloading process may be transferred from the unloading position 3a to the loading position 2a through the second departing position 3b between the unloading position 3a and the second arriving position 3c and the first arriving position 2b between the loading position 2a and the first departing position 2c.

This may include allowing the unloading ascending/descending system 34 to move the test tray T (having been subjected to the unloading process) down from the unloading position 3c to the second departing position 3b, allowing the third transferring unit 63 to transfer the test tray T from the second departing position 3b to the first arriving position 2b, and allowing the loading ascending/descending system 24 to move up the test tray T from the first arriving position 2b to the loading position 2a.

A packaged chip manufacturing method according to an example embodiment may include a configuration similar to the test tray transferring method. A detailed description thereof may be omitted.

The packaged chip manufacturing method may additionally include preparing the packaged chips to be tested. This may be performed by storing a user tray containing the packaged chips to be tested in the loading stacker 21. The packaged chips may be memory or non-memory packaged chips.

The loading process of containing the prepared packaged chips in the test tray T located at the loading position 2a may be performed by use of the packaged chip loading method.

This may be performed by actuating the first loading picker 221, the second loading picker 222 and the loading buffer 23 by use of the packaged chip loading method.

By repeatedly performing the above-mentioned, manufacturing of the packaged chips may be completed.

A test handler may be provided that includes: a loading unit including a loading buffer disposed to be movable along a moving path formed over a loading position at which a test tray is located at a time of containing packaged chips to be tested in the test tray and a loading picker to perform a loading process on the test tray located at the loading position. The test handler may further include a chamber system in which the packaged chips contained in the test tray transferred from the loading unit are connected to a hi-fix board and tested, an unloading unit including an unloading picker to perform an unloading process on the test tray located at an unloading position at which the test tray is located at the time of separating the tested packaged chips from the test tray transferred from the chamber system and being disposed aside the loading unit, and at least one rotating unit disposed between the loading unit and the unloading unit, to rotate the test tray transferred from the loading unit from a horizontal posture to a vertical posture, and to rotate the test tray transferred from the chamber system from a vertical posture to a horizontal posture. The test handler may further include a transferring unit to transfer the test tray from the loading unit to the rotating unit, to transfer the test tray from the rotating unit to the unloading unit, and to transfer the test tray from the unloading unit to the loading unit.

According to another embodiment, a packaged chip loading method may be provided that includes: allowing a first loading picker to pick up packaged chips to be tested from a user tray located in a loading stacker and to contain the picked-up packaged chips in a loading buffer, and allowing the loading buffer to move along a loading moving path formed over a loading position (which is a position where a test tray is located at the time of containing the packaged chips in the test tray) so as to be located above the test tray at the loading position. The method may also include allowing the second loading picker to pick up the packaged chips to be tested from the loading buffer, allowing the loading buffer to move along the loading moving path to a position where the first loading picker can contain the packaged chips to be tested in the loading buffer, and allowing the second loading picker to partition the test tray located at the loading position into a plurality of containing areas and to contain the packaged chips to be tested in the containing areas.

According to another embodiment, a test tray transferring method may be provided that includes: performing a loading process on a test tray located at a loading position where the test tray is located at a time of containing packaged chips to be tested in the test tray, transferring the test tray having been subjected to the loading process from the loading position to a rotating unit, and rotating the test tray located in the rotating unit and having been subjected to the loading process from a horizontal posture to a vertical posture and then transferring the test tray from the rotating unit to a chamber system. The method may also include allowing the chamber system to adjust the packaged chips contained in the test tray to a testing temperature, to connect the packaged chips adjusted to the testing temperature to a hi-fix board and test the packaged chips, and then to restore the tested packaged chips to a normal temperature. Still further, the method may include transferring the test tray containing the tested packaged chips from the chamber system to the rotating unit and then rotating the test tray from the vertical posture to the horizontal posture, transferring the test tray located in the rotating unit and containing the tested packaged chips, to an unloading position where the test tray is located at the time of separating the tested packaged chips from the test tray, performing an unloading process on the test tray located at the unloading position, and transferring the test tray having been subjected to the unloading process from the unloading position to the loading position.

According to another embodiment, a packaged chip manufacturing method may be provided that includes: preparing packaged chips to be tested, performing a loading process on a test tray located at a loading position where the test tray is located at the time of containing the prepared packaged chips to be tested in the test tray, transferring the test tray having been subjected to the loading process from the loading position to a rotating unit, and rotating the test tray located in the rotating unit and has been subjected to the loading process, from a horizontal posture to a vertical posture and then transferring the test tray from the rotating unit to a chamber system. The method may also include allowing the chamber system to adjust the packaged chips contained in the test tray to a testing temperature, to connect the packaged chips adjusted to the testing temperature to a hi-fix board and test the packaged chips, and then to restore the tested packaged chips to a normal temperature. Still further, the method may include transferring the test tray containing the tested packaged chips from the chamber system to the rotating unit and then rotating the test tray from the vertical posture to the horizontal posture, transferring the test tray located in the rotating unit and containing the tested packaged chips, to an unloading position where the test tray is located at the time of separating the tested packaged chips from the test tray, performing an unloading process on the test tray located at the unloading position, and transferring the test tray having been subjected to the unloading process from the unloading position to the loading position.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A test handler comprising:
   a loading unit including a loading buffer and a loading picker, the loading buffer to move along a loading moving path formed over a loading position at which a test tray is located at a time of providing packaged chips to be tested to the test tray, and the loading picker to perform a loading process on the test tray at the loading position;

a chamber system to receive the packaged chips contained in the test tray from the loading unit, to connect the packaged chips to a hi-fix board for testing of the packaged chips;

an unloading unit including an unloading picker to perform an unloading process on the test tray located at an unloading position at which the test tray is located at a time of separating the tested packaged chips from the test tray, wherein the loading unit is provided aside the loading unit;

at least one rotating unit between the loading unit and the unloading unit, to rotate the test tray transferred from the loading unit from a horizontal posture to a vertical posture, and to rotate the test tray transferred from the chamber system from a vertical posture to a horizontal posture; and a transferring unit to transfer the test tray from the loading unit to the at least one rotating unit, to transfer the test tray from the at least one rotating unit to the unloading unit, and to transfer the test tray from the unloading unit to the loading unit, wherein the loading buffer to move along the loading moving path so as to overlap with the test tray located at the loading position.

2. The test handler according to claim 1, wherein the loading picker includes a first loading picker to pick up the packaged chips to be tested from a user tray located in a loading stacker and to provide the picked-up packaged chips to the loading buffer, and a second loading picker to pick up the packaged chips to be tested from the loading buffer and to provide the picked-up packaged chips to the test tray located at the loading position, wherein the second loading picker to partition the test tray located at the loading position into a plurality of containing areas and to provide the packaged chips to be tested in the plurality of containing areas.

3. The test handler according to claim 2, wherein the loading buffer to move along the loading moving path such that a moving distance of the second loading picker is reduced at a time of the second loading picker performing the loading process.

4. The test handler according to claim 1, wherein the loading picker includes a first loading picker having a plurality of first nozzle units, and a second loading picker having a plurality of second nozzle units;

wherein the first loading picker includes a first control unit to control a gap in a column direction of the first nozzle units, wherein the first loading picker to pick up the packaged chips from the user tray and provide the picked-up packaged chips to the loading buffer; and wherein the second loading picker includes a second control unit to control a gap in a row direction of the second nozzle units, wherein the second loading picker to pick up the packaged chips from the loading buffer and provide the picked-up packaged chips to the test tray located at the loading position.

5. The test handler according to claim 4, wherein the first control unit includes a first guide plate having a plurality of first guide holes to couple to the first nozzle units and a first ascending/descending unit to move the first guide plate so the first nozzle units move along the first guide holes to control the gap therebetween, wherein the second control unit includes a second guide plate having a plurality of second guide holes to couple to the second nozzle units and a second ascending/descending unit to move the second guide plate so the second nozzle units move along the second guide holes to control the gap therebetween.

6. The test handler according to claim 5, wherein the first guide plate and the second guide plate are perpendicular to each other.

7. The test handler according to claim 1, wherein the loading picker includes a first loading picker having a plurality of first nozzle units to attach to the packaged chips, and a second loading picker having a plurality of second nozzle units to attach to the packaged chips, wherein the first loading picker includes a first control unit to control a gap in a row direction of the first nozzle units, wherein the first loading picker to pick up the packaged chips from the user tray and provide the picked-up packaged chips to the loading buffer, and wherein the second loading picker includes a second control unit to control a gap in a column direction of the second nozzle units, wherein the second loading picker to pick up the packaged chips from the loading buffer and provide the picked-up packaged chips to the test tray located at the loading position.

8. The test handler according to claim 7, wherein the first control unit includes a first guide plate having a plurality of first guide holes to couple to the first nozzle units and a first ascending/descending unit to move the first guide plate so the first nozzle units move along the first guide holes to control the gap therebetween, wherein the second control unit includes a second guide plate having a plurality of second guide holes to couple to the second nozzle units and a second ascending/descending unit to move the second guide plate so the second nozzle units move along the second guide holes to control the gap therebetween.

9. The test handler according to claim 8, wherein the first guide plate is perpendicular to the second guide plate.

10. The test handler according to claim 1, wherein the loading unit includes a loading ascending/descending unit to move the test tray along a first ascending/descending path that includes the loading position, a first arriving position, and a first departing position, the first arriving position being located below the loading position and the first departing position being located below the first arriving position, wherein the unloading unit includes an unloading ascending/descending unit to move the test tray along a second ascending/descending path that includes the unloading position, a second departing position, and a second arriving position, the second departing position being located below the unloading position and the second arriving position being located below the second departing position, wherein the rotating unit is provided between the first departing position and the second arriving position, and wherein the transferring unit includes a first transferring unit to transfer the test tray containing the tested packaged chips from the rotating unit to the second arriving position, a second transferring unit to transfer the test tray from the first departing position to the rotating unit, and a third transferring unit to transfer the test tray from the second departing position to the first arriving position.

11. A semiconductor device loading method having a first loading picker and a second loading picker, the method comprising:

picking up, by the first loading picker, packaged chips to be tested from a user tray located in a loading stacker and providing the picked-up packaged chips to a loading buffer;

moving the loading buffer along a loading moving path formed over a loading position, the loading position being a position where a test tray is located at a time of providing the packaged chips to the test tray, so the loading buffer overlaps with the test tray located at the loading position;

picking up, by the second loading picker, the packaged chips to be tested from the loading buffer;

moving the loading buffer along the loading moving path to a position where the first loading picker provides the packaged chips to be tested to the loading buffer; and partitioning, using the second loading picker, the test tray located at the loading position into a plurality of containing areas and providing the packaged chips to be tested to the containing areas.

12. The method according to claim 11, wherein moving the loading buffer along the loading moving path to overlap with the test tray located at the loading position includes moving the loading buffer along the loading moving path so the packaged chips contained in the loading buffer are located above the containing area where the second loading picker provides the packaged chips to be tested to the test tray located at the loading position.

13. The method according to claim 12, wherein partitioning the test tray includes the second loading picker to move to another containing area that is adjacent to the containing area where the second loading picker provides the packaged chips to be tested to the test tray located at the loading position.

14. The method according to claim 11, wherein moving the loading buffer along the loading moving path includes moving the loading buffer along the loading moving path so the packaged chips contained in the loading buffer are located above another containing area that is adjacent to the containing area where the second loading picker provides the packaged chips to be tested to the test tray located at the loading position.

15. The method according to claim 11, wherein picking up the packaged chips to be tested from the user tray includes:

narrowing a gap in a row direction or a column direction of a plurality of first nozzle units provided in the first loading picker;

picking up the packaged chips to be tested from the user tray located in the loading stacker by use of the first nozzle units having the narrowed gap;

widening the gap in the row direction or in the column direction of the first nozzle units having attached to the packaged chips to be tested; and allowing the first loading picker to provide the packaged chips to be tested to the loading buffer by use of the first nozzle units having the widened gap.

16. The method according to claim 11, wherein picking up the packaged chips to be tested from the user tray is performed at a same time as partitioning the test tray located at the loading position into the plurality of containing areas and to provide the packaged chips to be tested in the containing areas.

17. A method comprising:

performing a loading process on a test tray located at a loading position where the test tray is located at a time of providing packaged chips to be tested to the test tray;

transferring the test tray subjected to the loading process from the loading position to a rotating unit;

rotating the test tray in the rotating unit from a horizontal posture to a vertical posture and then transferring the test tray from the rotating unit to a chamber system;

adjusting the packaged chips contained in the test tray to a testing temperature, connecting the packaged chips adjusted to the testing temperature to a hi-fix board for testing the packaged chips, and then restoring the tested packaged chips to a normal temperature;

transferring the test tray containing the tested packaged chips from the chamber system to the rotating unit and rotating the test tray from the vertical posture to the horizontal posture;

transferring the test tray from the rotating unit to an unloading position where the test tray is located at a time of separating the tested packaged chips from the test tray;

performing an unloading process on the test tray located at the unloading position; and transferring the test tray subjected to the unloading process from the unloading position to the loading position, wherein performing the loading process includes:

picking up the packaged chips to be tested from a user tray located in a loading stacker and providing the picked-up packaged chips to a loading buffer using a first loading picker, moving the loading buffer along a loading moving path formed over the loading position so as to overlap with the test tray at the loading position, picking up the packaged chips to be tested from the loading buffer using a second loading picker, moving the loading buffer along the loading moving path to a position where the first loading picker provides the packaged chips to be tested to the loading buffer, and partitioning the test tray located at the loading position into a plurality of containing areas and providing the packaged chips to be tested to the containing areas using the second loading picker.

18. The method according to claim 17, wherein moving the loading buffer along the loading moving path includes moving the loading buffer along the loading moving path so that the packaged chips contained in the loading buffer are located above the containing area where the second loading picker provides the packaged chips to be tested to the test tray located at the loading position.

19. The method according to claim 18, wherein partitioning the test tray includes moving to another containing area that is adjacent to the containing area where the second loading picker provides the packaged chips to be tested to the test tray located at the loading position.

20. The method according to claim 17, wherein moving the loading buffer along the loading moving path includes moving the loading buffer along the loading moving path so the packaged chips contained in the loading buffer are located above another containing area that is adjacent to the containing area where the second loading picker provides the packaged chips to be tested to the test tray located at the loading position.

21. The method according to claim 17, further comprising:

preparing packaged chips to be tested prior to performing the loading process.

* * * * *